US009956774B2

(12) United States Patent
Mizukami

(10) Patent No.: US 9,956,774 B2
(45) Date of Patent: May 1, 2018

(54) ELECTROMECHANICAL TRANSDUCER ELEMENT, LIQUID DISCHARGE HEAD, LIQUID DISCHARGE DEVICE, METHOD FOR PRODUCING ELECTROMECHANICAL TRANSDUCER FILM, AND METHOD FOR PRODUCING LIQUID DISCHARGE HEAD

(71) Applicant: Satoshi Mizukami, Kanagawa (JP)

(72) Inventor: Satoshi Mizukami, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days. days.

(21) Appl. No.: 15/370,025

(22) Filed: Dec. 6, 2016

(65) Prior Publication Data

US 2017/0173955 A1 Jun. 22, 2017

(30) Foreign Application Priority Data

Dec. 17, 2015 (JP) ................................ 2015-246661

(51) Int. Cl.

*H01L 41/187* (2006.01)
*B41J 2/14* (2006.01)
*B41J 2/16* (2006.01)

(52) U.S. Cl.

CPC ....... *B41J 2/14201* (2013.01); *B41J 2/14233* (2013.01); *B41J 2/161* (2013.01); *B41J 2/1607* (2013.01); *B41J 2/1629* (2013.01); *B41J 2/1631* (2013.01); *B41J 2/1632* (2013.01); *B41J 2/1635* (2013.01); *B41J 2/1645* (2013.01); *B41J 2/1646* (2013.01)

(58) Field of Classification Search

CPC ........ B41J 2/1607; B41J 2/161; B41J 2/1631; B41J 2/1632; B41J 2/1635; B41J 2/1645; B41J 2/1646; B41J 2/14201; B41J 2/14233; B41J 2/1629; H01L 41/187

USPC ....... 310/358; 252/62.9 R, 62.9 PZ; 501/134

See application file for complete search history.

(56) References Cited

U.S. PATENT DOCUMENTS

| | | | |
|---|---|---|---|
| 7,279,825 | B2 | 10/2007 | Ifuku et al. |
| 7,562,968 | B2 | 7/2009 | Sumi et al. |
| 7,622,852 | B2 | 11/2009 | Ifuku et al. |
| 7,804,231 | B2 | 9/2010 | Ifuku et al. |

(Continued)

FOREIGN PATENT DOCUMENTS

| | | |
|---|---|---|
| JP | 4717344 | 7/2011 |
| JP | 4984018 | 7/2012 |

(Continued)

*Primary Examiner* — Thomas Dougherty
(74) *Attorney, Agent, or Firm* — IPUSA, PLLC

(57) ABSTRACT

An electromechanical transducer element includes an electromechanical transducer film formed of PZT, wherein Ti/(Zr+Ti) in the electromechanical transducer film is greater than or equal to 45% and less than or equal to 55%, and wherein, when a total of peak intensity values obtained by θ-2θ measurement is set to be 1, for an orientation ratio of a (100) plane orientation calculated based on a ratio of the peak intensity value of each orientation, Δρ(100) is less than or equal to 5%, wherein Δρ(100) is a gradient with respect to the (100) plane orientation in an array direction, and the ratio of each peak intensity value of each orientation is represented by ρ(hkl)=I(hkl)/ΣI(hkl), where ρ(hkl) is a degree of orientation in an (hkl) plane orientation, I(hkl) is the peak intensity value of the orientation, and ΣI(hkl) is the total of the peak intensity values.

8 Claims, 16 Drawing Sheets

(56) References Cited

U.S. PATENT DOCUMENTS

| | | | |
|---|---|---|---|
| 7,857,431 | B2 | 12/2010 | Fukui et al. |
| 7,948,154 | B2 | 5/2011 | Ifuku et al. |
| 8,454,133 | B2 | 6/2013 | Mizukami et al. |
| 8,602,530 | B2 | 12/2013 | Mizukami et al. |
| 8,727,505 | B2 | 5/2014 | Mizukami et al. |
| 8,733,904 | B2 | 5/2014 | Mizukami |
| 8,733,906 | B2 | 5/2014 | Mizukami et al. |
| 8,919,926 | B2 | 12/2014 | Mizukami et al. |
| 9,022,530 | B2 | 5/2015 | Ohashi |
| 9,168,744 | B2 | 10/2015 | Mizukami et al. |
| 9,186,894 | B2 | 11/2015 | Mizukami et al. |
| 9,385,298 | B2 | 7/2016 | Mizukami et al. |
| 9,401,471 | B2 | 7/2016 | Mizukami et al. |
| 9,627,606 | B2 * | 4/2017 | Mizukami ............. H01L 41/187 |
| 2006/0230590 | A1 * | 10/2006 | Kuriki .................. B41J 2/14233 29/25.35 |
| 2015/0349240 | A1 | 12/2015 | Mizukami |
| 2016/0099402 | A1 * | 4/2016 | Mizukami ................ B41J 2/161 347/70 |
| 2016/0263898 | A1 * | 9/2016 | Kobayashi ........... B41J 2/16538 |
| 2016/0351788 | A1 * | 12/2016 | Mizukami ............. H01L 41/187 |

FOREIGN PATENT DOCUMENTS

| | | |
|---|---|---|
| JP | 5041765 | 10/2012 |
| JP | 2012-253161 | 12/2012 |
| JP | 5127268 | 1/2013 |
| JP | 5164052 | 3/2013 |
| JP | 5300184 | 9/2013 |
| JP | 2015-225957 | 12/2015 |

* cited by examiner

ELECTROMECHANICAL TRANSDUCER ELEMENT, LIQUID DISCHARGE HEAD, LIQUID DISCHARGE DEVICE, METHOD FOR PRODUCING ELECTROMECHANICAL TRANSDUCER FILM, AND METHOD FOR PRODUCING LIQUID DISCHARGE HEAD

BACKGROUND OF THE INVENTION

1. Field of the Invention

The present disclosure relates to an electromechanical transducer element, a liquid discharge head, a liquid discharge device, a method for producing an electromechanical transducer film, and a method for producing a liquid discharge head.

2. Description of the Related Art

As a liquid discharge head that is used for an image recording device or an image forming device, such as a printer, a facsimile, and a copier, the following configuration has been known. A liquid discharge head includes a nozzle for discharging an ink droplet; a pressure chamber that communicates with the nozzle; and an electromechanical transducer element for applying pressure to ink inside the pressure chamber, such as a piezoelectric element. As for the liquid discharge head, two types have been implemented, which are a liquid discharge head in which an actuator for a vertical vibration mode is used and a liquid discharge head in which an actuator for a torsional vibration mode is used.

To enhance discharging efficiency, it can be considered to obtain large displacement by adjusting a crystalline orientation. In order to achieve this, a crystalline orientation ratio of lead zirconate titanate (PZT) can be adjusted, so that crystals are preferentially oriented in a (100) plane. In Patent Document 1 (Japanese Unexamined Patent Application Publication No. 2012-253161), for a (100) plane and a (001) plane of a tetragonal crystal, a twin plane has been proposed, which is formed of a domain, the (100) plane, and the (001).

Specifically, in order to arrange a favorable crystal orientation of PZT, in Patent Document 1, the electromechanical transducer film includes a piezoelectric film formed of a perovskite type crystal including, at least, lead (Pb), titanium (Ti), and zirconium (Zr); and an electrode formed on the piezoelectric film. Here, an X-ray diffraction peak position (2θ) derived from the (100) plane of the piezoelectric film is adjusted to be greater than or equal to 21.89 and less than or equal to 21.97, and the width (2θ) of the (200) plane is adjusted to be greater than or equal to 0.30 and less than or equal to 0.50.

The electromechanical transducer film disclosed in Patent Document 2 (Japanese Patent No. 4984018) includes a piezoelectric film formed of lead zirconate titanate (PZT) such that the piezoelectric film is preferentially oriented in the (100) plane by the perovskite type crystal; and a lower electrode and an upper electrode that nip the piezoelectric film. Here, an X-ray diffraction peak position 2θ derived from the (100) plane of the piezoelectric film is adjusted to be within a range from 21.79 degrees through 21.88 degrees; the distance between the adjacent (100) planes at this X-ray peak position is adjusted to be 4.05±0.03; and tensile stress in the film is adjusted to be within a range from 100 MPa through 200 MPa.

SUMMARY OF THE INVENTION

According to an aspect of the present invention, there is provided an electromechanical transducer element including a lower electrode; an electromechanical transducer film; and an upper electrode, wherein the electromechanical transducer element is disposed on an oscillation film on a substrate, wherein the electromechanical transducer film is formed of lead (P) zirconate (Zr) titanate (Ti) (PZT), wherein a composition ratio of Ti in the electromechanical transducer film, defined as Ti/(Zr+Ti), is greater than or equal to 45% and less than or equal to 55%, wherein, in a crystalline orientation of the electromechanical transducer film, for an orientation ratio of a (100) plane orientation calculated based on a ratio of a peak intensity value of each orientation when a total of the peak intensity values obtained by θ-2θ measurement of an X-ray diffraction method is set to be 1, $\Delta\rho(100)$ is less than or equal to 5%, wherein $\Delta\rho(100)$ is a gradient with respect to the (100) plane orientation in an array direction, and the ratio of each peak intensity value of each orientation is represented by $\rho(hkl)=I(hkl)/\Sigma I(hkl)$, where $\rho(hkl)$ is a degree of orientation in an (hkl) plane orientation, $I(hkl)$ is the peak intensity value of the orientation, and $\Sigma I(hkl)$ is the total of the peak intensity values.

Other objects, features and advantages of the present invention will become more apparent from the following detailed description when read in conjunction with the accompanying drawings.

DETAILED DESCRIPTION OF THE PREFERRED EMBODIMENTS

Figure 1:
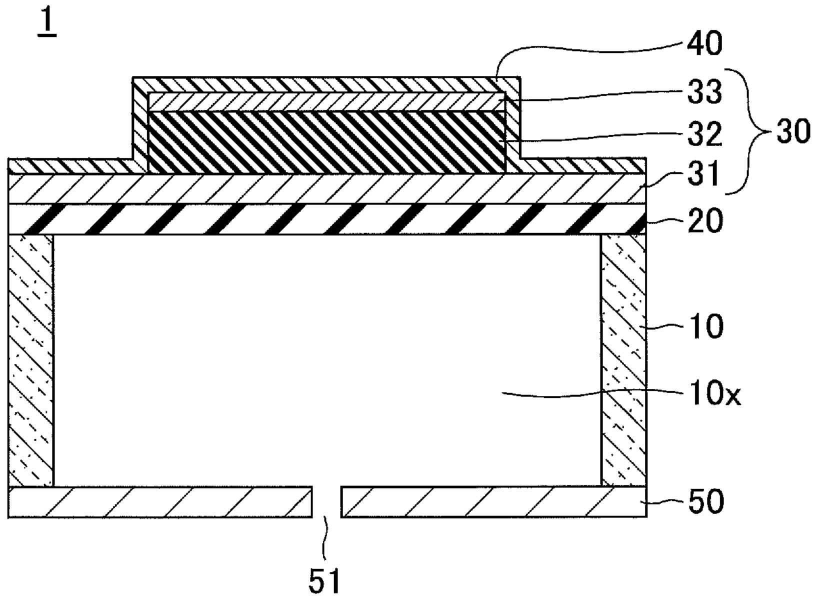
FIG. 1 is a cross-sectional view exemplifying a part of a liquid discharge head according to an embodiment of the present invention.

In general, a small piece of lead zirconate titanate (PZT) cut out from a large wafer is used as a material of the piezoelectric element. For a case where there is a variation in PZT film properties at an outer fringe portion of the wafer, if such a PZT film at the fringe portion of the wafer is used as the material of the piezoelectric element, discharging performance, such as an ink discharge amount and a discharge rate at a time of discharging ink, may be varied between sequences or within a sequence. As a result, quality of printing may be failed.

In Patent Documents 1 and 2, there is a description about initial displacement. However, unevenness of crystals in an array direction of a discharge head has not been considered.

There is a need for an electromechanical transducer element that addresses unevenness of the crystals.

According to an embodiment, in an electromechanical transducer element, unevenness of the crystals can be addressed.

Embodiments for implementing the present invention are described below by referring to the accompanying drawings. In the drawings, same reference numerals may be attached to the same components, and duplicate descriptions may be omitted.

FIG. 1 is a cross-sectional view exemplifying a part of a liquid discharge head according to an embodiment. Referring to FIG. 1, a section 1 of the liquid discharge head includes a substrate 10; an oscillation plate 20; an electromechanical transducer element 30; and an insulation and protection film 40. The electromechanical transducer element 30 includes a lower electrode 31; an electromechanical transducer film 32; and an upper electrode 33.

In the section 1 of the liquid discharge head, the oscillation plate 20 is formed on the substrate 10; and the lower electrode 31 of the electromechanical transducer element 30 is formed on the oscillation plate 20. The electromechanical transducer film 31 is formed on a predetermined area of the lower electrode 31; and the upper electrode 33 is formed on the electromechanical transducer film 32. The insulation and protection film 40 covers the electromechanical transducer element 30. The insulation and protection film 40 includes openings for selectively exposing the lower electrode 31 and the upper electrode 33; and the lower electrode 31 and the upper electrode 33 can be wired (cf. FIGS. 8A and 8B) through the corresponding openings.

A lower part of the substrate 10 is bonded to a nozzle plate 50 provided with a nozzle 51 for discharging an ink droplet. The nozzle plate 50, the substrate 10, and the oscillation plate 20 form a pressure chamber 10*x* (which may be referred to as an ink flow channel, a pressure liquid chamber, a pressurizing chamber, a discharge chamber, or a liquid chamber) that communicates with the nozzle 51. The oscillation plate 20 forms a part of a wall surface of the ink flow channel. In other words, the pressure chamber 10*x* is partitioned by the substrate (which forms a side surface), the nozzle plate 50 (which forms a lower surface), and the oscillation plate 20 (which forms an upper surface); and the pressure chamber 10*x* communicates with the nozzle 51.

The above-described liquid discharge head can be applied, for example, to an inkjet recording device and a liquid discharge head, which can be used as an image recording device or an image forming device, such as a printer, a facsimile machine, and a copier. For example, a liquid discharge head has been known that includes a nozzle for discharging a liquid droplet with a size in a range from several micrometers through several tens of micrometers; a liquid chamber that communicates with the nozzle; an oscillation plate that forms a wall surface of the liquid chamber; and an actuator (an energy generator) for applying pressure to a recording liquid in the liquid chamber through the oscillation plate.

As for an inkjet recording head, two types have been implemented, which are an inkjet recording head for which a piezoelectric actuator for a vertical vibration mode is used and an inkjet recording head for which a piezoelectric actuator for a torsional vibration mode is used. The piezoelectric actuator for the vertical vibration mode extends and shrinks in a direction of an axis of a piezoelectric element.

As an example of a method for forming an actuator for the torsional vibration mode, there is a method for forming individual piezoelectric elements for corresponding pressure generating chambers such that a uniform piezoelectric material layer is formed over the entire surface of an oscillation plate by a film formation technique, and the piezoelectric material layer is cut and divided into shapes corresponding to the shapes of the pressure generating chambers by a lithography method.

Figure 2:
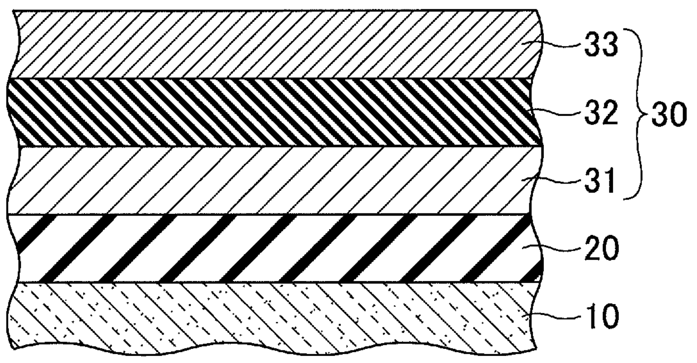
FIG. 2 is a schematic cross-sectional view illustrating a configuration of an electromechanical transducer element according to the embodiment of the present invention.

FIG. 2 is a schematic cross-sectional view illustrating a configuration of the electromechanical transducer element of FIG. 1. In order to produce the liquid discharge head, as illustrated in FIG. 2, the oscillation plate 20, the lower electrode 31, the electromechanical transducer film 32, and the upper electrode 33 are sequentially laminated on the substrate 10. After that, the lower electrode 31, the electromechanical transducer film 32, and the upper electrode 33 are etched into a desired shape; and, then, the lower electrode 31, the electromechanical transducer film 32, and the upper electrode 33, which are etched, are covered with the insulation and protection film 40.

Then, openings for selectively exposing the lower electrode 31 and the upper electrode 33 are formed in the insulation and protection film 40. After that, the pressure chamber 10*x* is formed by etching the substrate 10 from below. Subsequently, a bottom surface of the substrate 10 is bonded to the nozzle plate 50 provided with the nozzle 51, and thereby the liquid discharge head 1 is completed.

Here, as the electromechanical transducer film according to the embodiment of the present invention, a silicon single crystal substrate is preferably used. Usually, a thickness of the electromechanical transducer film is preferably from 100 μm through 600 μm. As for the plane orientation, there are three types, which are (100), (110), and (111). In the semiconductor industry, in general, (100) and (111) are widely used.

For producing a pressure chamber, such as that of illustrated in FIG. 1, a silicon single crystal substrate is processed by utilizing etching. As for the etching method in this case, anisotropic etching is used in general. Anisotropic etching is a method that utilizes a property that an etching rate differs depending on a plane orientation of a crystal structure. For example, for anisotropic etching in which a crystal is immersed in an alkaline solution, such as KOH, an etching rate for the (111) plane is approximately 1/400 compared to an etching rate for the (100) plane.

It has been known that, for the plane orientation (100), a structure with an inclination of approximately 54 degrees can be produced. For the plane orientation (110), deeper grooves can be formed, so that, while maintaining more stiffness, array density can be increased. Thus, a single crystal substrate provided with the (110) plane orientation can be used for the configuration according to the embodiment. However, in this case, $SiO_2$, which is a mask material, may also be etched. Thus, various values are to be set, while taking into consideration of this phenomenon.

Figure 3:
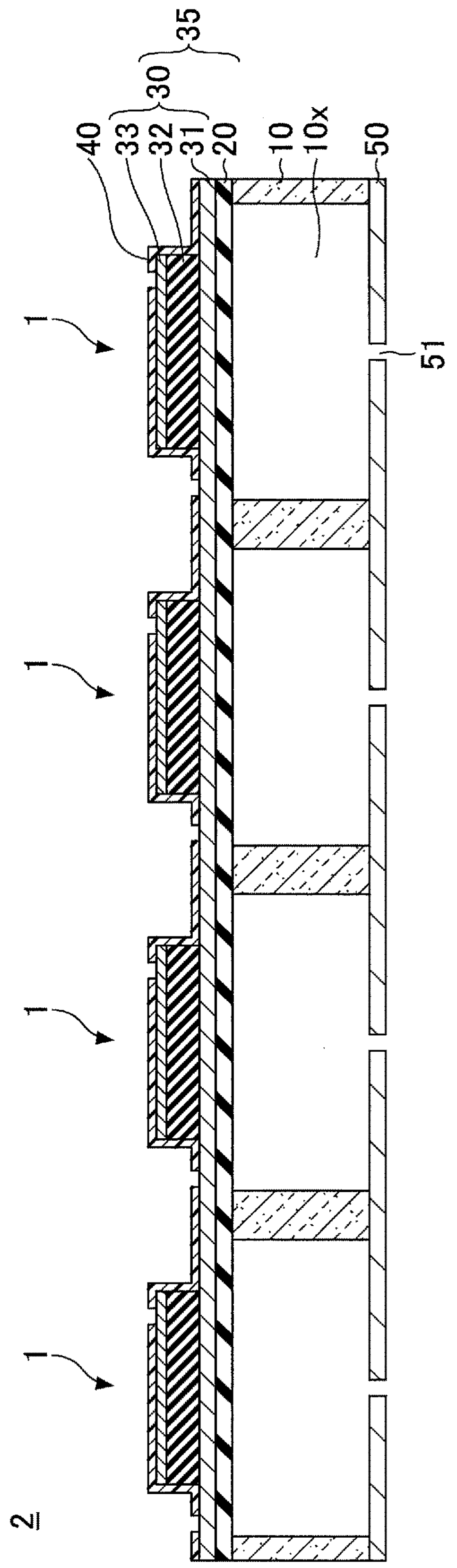
FIG. 3 is a cross-sectional view of a configuration of a liquid discharge head, in which a plurality of electromechanical transducer elements according to the embodiment of the present invention is arrayed.

FIG. 3 is a cross-sectional view illustrating a configuration of a liquid discharge head 2 such that a plurality of electromechanical transducer elements 30 according to the embodiment of the present invention is arrayed. Note that, in FIG. 1, only the single section 1 corresponding to the single nozzle 51 of the single liquid discharge head is illustrated. Actually, as illustrated in FIG. 3, the liquid discharge head 2 is manufactured such that the plurality of the sections 1 of the liquid discharge heads respectively including the electromechanical transducer elements 20 are arrayed in a predetermined direction.

The liquid discharge head 2 includes discharge driving units 35 that are obtained by arranging the plurality of electromechanical transducer elements 30 on the oscillation plate 20; the nozzles 51 for discharging a liquid, which correspond to the electromechanical transducer elements 30, respectively; the pressure chambers 10$x$ that communicate with the nozzles 51, respectively. In the liquid discharge head 2, a part of the wall of the pressure chamber 10$x$ is formed of the oscillation plate 20, and the discharge driving unit 35 can increase pressure of the liquid inside the pressure chamber 10$x$.

When the electromechanical transducer elements 30 are arrayed as illustrated in FIG. 3, a variation in a piezoelectric property of a piezoelectric film is preferably small, so that a variation in ink discharge amounts and a variation in discharge rates at a time of discharging the ink can be reduced.

<Property of the Piezoelectric Film>

When a vector component of a spontaneous polarization axis of the piezoelectric film matches a direction in which an electric field is applied, shrinkage and expansion of the piezoelectric film is effectively caused by fluctuation in intensity of the applied electric field, and a large piezoelectric constant can be obtained. It is most preferable that the spontaneous polarization axis completely matches the direction in which the electric field is applied.

Especially, an ink discharge amount and a discharge rate at a time of discharging ink are significantly affected when, among various types of variations at the time of discharging the ink, a specific variation in the piezoelectric property occurs, such as a gradient within a sequence of arrayed elements or between sequences of arrayed elements. Note that the specific variation differs from a random variation among elements. Consequently, if such a specific variation in the piezoelectric property occurs, it can be clearly recognized as a failure in quality of actual printing on a paper sheet.

There is a need for reducing, in addition to the random variations among elements, a specific variation in the piezoelectric property, such as a gradient within a sequence of elements arrayed in a head or between sequences of elements arrayed in respective heads. Especially, for a case of forming a piezoelectric element by a Si wafer process of 6 inches or more, such as a MEMS process, film formation of each layer and processing (e.g., etching) are to be performed; and, as a result, variation occurs from the center of the wafer to the outer fringe of the wafer, such as a variation in a film thickness formed on the wafer surface and a variation in a property of the film on the wafer surface.

Consequently, for assembling a discharge head, when a chip (a Non-OF chip), in which piezoelectric elements are integrated, located at the center of the wafer is compared with a chip (a OF chip) located at the outer fringe portion, the chip OF located at the outer fringe portion tends to have a gradient in a piezoelectric property between sequences or within a sequence. Thus, an inkjet head assembled with a chip formed at the outer fringe portion of the wafer tends to have a gradient in a piezoelectric property between the sequences or within a sequence, such as an ink discharge amount and a discharge rate at a time of discharging ink. As a result, there can be a failure in quality of printing.

For example, during assembly of the discharge head, by selecting only chips located at the center of the wafer, a failure head in which the discharging performance is significantly varied can be prevented from being manufactured. However, considering a yield rate of chips located at the outer fringe portion of the wafer, failures are to be occurred corresponding to the number of the piezoelectric elements at the outer fringe portion, so that the cost for producing can be significantly increased when the total process is considered.

Furthermore, for a head that is formed of a chip located at the outer fringe portion of the wafer, the variation can be corrected, for example, by correcting a voltage waveform at a time of discharging. However, a head formed of a chip located at the center of the wafer coexists. For the head formed of the chip located at the center of the wafer, the variation is small. Consequently, in a liquid discharge device including one or more liquid discharge heads, it may be required to prepare a plurality of waveforms for the system. Thus, it can be a factor of increasing the cost for producing the main body of the liquid discharge device (e.g., an image forming device) itself.

Figure 4A:
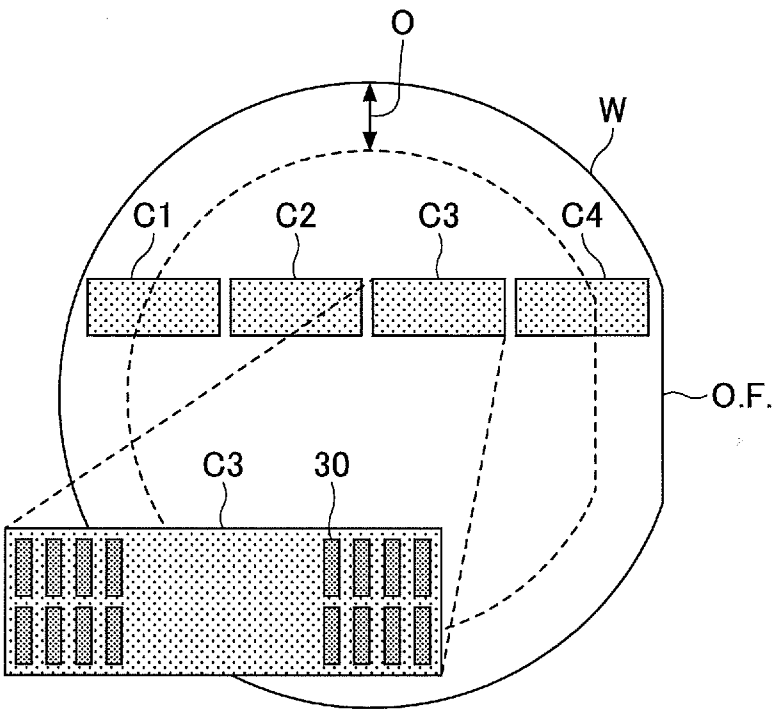
FIG. 4A is a diagram illustrating a displacement amount in a sequence of chips in a wafer.
Figure 4B:
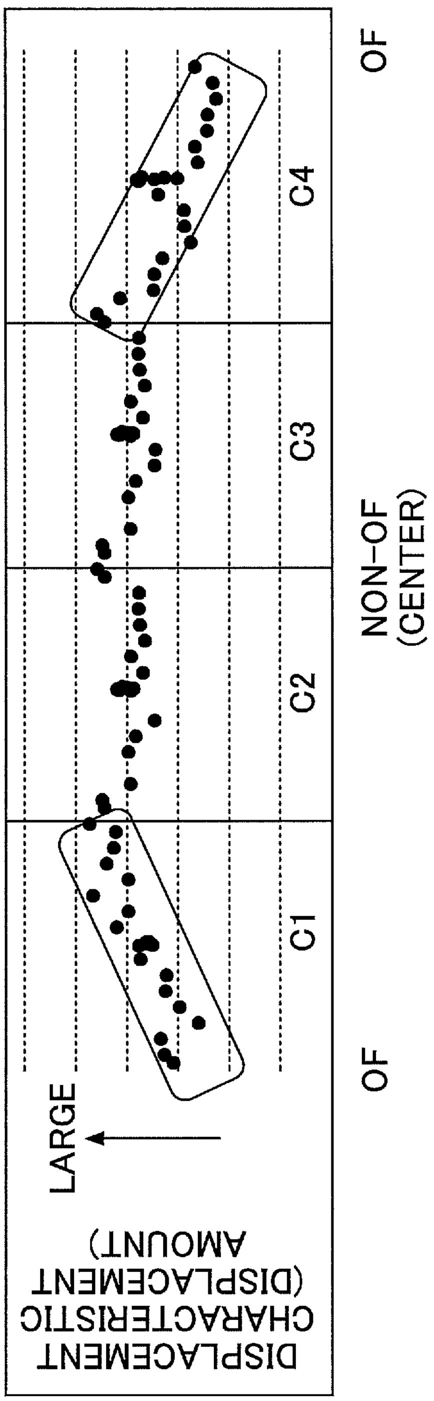
FIG. 4B is a diagram illustrating the displace amount in the sequence of chips in the wafer.

As one of the characteristics of the piezoelectric element that affects the ink discharge amount and a discharge rate at a time of discharging ink, there is a displacement characteristic. For example, by observing, within a sequence, a displacement amount of a chip (OF) at the outer fringe portion of the wafer and a displacement amount of a chip (Non-OF) at the center of the wafer, as illustrated in FIG. 4B, it can be seen that there is a tendency that the displacement amount of the crystal becomes smaller at the outer fringe portion.

Here, the displacement characteristic itself also affects piezoelectric distortion that is affected by a film property of a piezoelectric material; a size of the pressure chamber, such as that of illustrated in FIG. 1; and a film thickness of each layer of the electromechanical transducer element 30 illustrated in FIG. 2. It is considered that the variations in the piezoelectric distortion, the size of the pressure chamber, and the film thickness of each layer on the wafer surface from the center to the outer fringe portion of the wafer causes the results, such as that of shown in FIG. 4B.

Generally, as the piezoelectric material, lead zirconate titanate (PZT) is used. In the embodiment of the present invention, the film properties of the PZT are adjusted, and the adjusted PZT is utilized.

By the occurrence of the variation in the film properties of the PZT at the outer fringe portion of the wafer, a gradient in discharging performance tends to occur, such as an ink discharging amount or a discharge rate at a time of discharging ink, between sequences or within a sequence; and, consequently, there can be a failure in quality of printing.

Immediately after forming the crystal of the piezoelectric material, the crystal has spontaneous polarization in various directions. Thus, even if an electric field is applied to the crystal of the piezoelectric material as it is, the distortions of the respective domains are cancelled, so that no distortion is observed as the entire crystal. When a polarization process is applied to the crystal so as to align the directions of the spontaneous polarization of respective domains, the crystal becomes capable of generating the displacement. The directions of the domains are important for a piezoelectric property.

Figure 5:
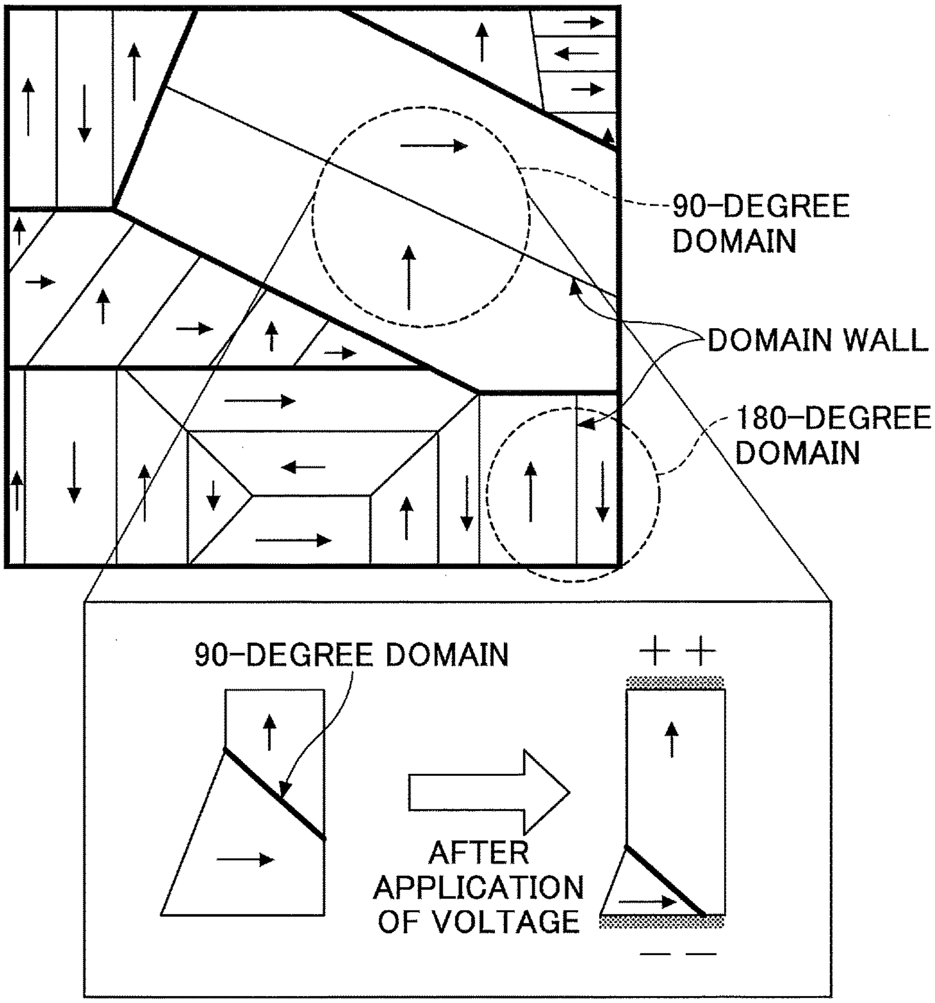
FIG. 5 is a diagram illustrating a state of a crystal system of the electromechanical transducer element.

FIG. 5 is a schematic diagram illustrating states of domains in the piezoelectric film, and states of crystal domains prior to and after application of an electric field. In FIG. 5, a domain is said to be a 90 degree domain if a direction of spontaneous polarization of the domain is perpendicular to a direction of spontaneous polarization of an adjacent domain; and a domain is said to be a 180 degree domain if the direction of the spontaneous polarization of the domain is parallel to the direction of the spontaneous polarization of the adjacent domain.

By applying a voltage to the crystal, a centroid of charges is shifted, and spontaneous polarization having electrical polarity is generated. By further applying an electric field to the crystal, each charge is pulled and a crystal lattice is distorted, so that a displacement occurs.

The displacement amount includes (i) a displacement amount caused by enlargement by piezoelectric distortion, and (ii) a displacement amount caused by enlargement of the distortion by rotation (rotational distortion) of a domain other than the 180 degree domain, such as the 90 degree domain. Note that the maximum displacement amount of the rotational distortion can be achieved when the domain rotates by 90 degrees.

Here, the piezoelectric distortion is said to be a distortion of the electromechanical transducer film such that, when an electric field is applied to the electromechanical transducer film while aligning the direction of the spontaneous polarization axis of the electromechanical transducer film with the direction in which the electric field is applied, the electromechanical transducer film expand or contract in the direction of the spontaneous polarization. Furthermore, the rotational distortion is said to be a distortion of the electromechanical transducer film such that, when an electric field is applied to the electromechanical transducer film while shifting the direction of the spontaneous polarization axis of the electromechanical transducer film from the direction in which the electric field is applied, the spontaneous polarization axis rotates toward the direction in which the electric field is applied.

When a PZT crystal is completely oriented in (111) plane orientation, only the compressive distortion of the above-described (i) contributes the displacement, and there is almost no effect by the domain rotation of (ii). Consequently, a failure may occur that the displacement amount is saturated in the middle of the displacement, and the displacement amount becomes small. Thus, even for a case where the (111) plane is to be preferentially oriented, in order to resolve a failure caused by reduction in the displacement amount, it may be required to include an orientation other than the (111) plane orientation.

Thus, in order to obtain a large displacement to enhance the discharging efficiency as a piezoelectric element, it is preferable that the crystal orientation ratio of the PZT be preferentially orientated in the (100) plane.

For example, a state of an existing crystal system differs depending on a ratio between Zr and Ti. As illustrated in FIG. 5, when a voltage is applied, the displacement amount is obtained, (1) as a displacement amount caused by enlargement by piezoelectric distortion, and (2) as a displacement amount caused by enlargement of the distortion by rotation of a domain.

In particular, for the domain rotation of (2), a large displacement is obtained by the existence of three crystal systems, which includes an a-domain and a c-domain of a tetragonal crystal.

Figure 6:
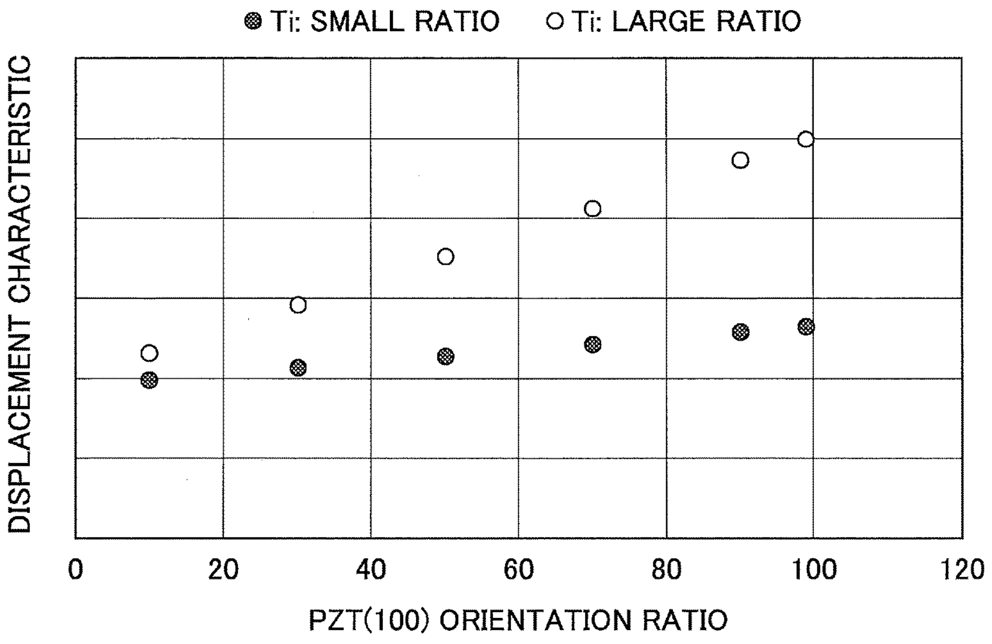
FIG. 6 is a diagram of a distribution of a displacement characteristic with respect to a crystalline orientation ratio when a ratio of Zr/Ti is varied.

FIG. 6 is a diagram of a distribution of a displacement characteristic of the PZT with respect to a crystalline orientation ratio when a ratio of Zr/Ti is varied. As illustrated in FIG. 6, depending on a ratio between Zr and Ti included in the PZT film, even if the variations in the orientation ratios are the same, it is possible that contributions to the variations in the displacements are different, and that a sufficient displacement is not obtained, though the PZT film is preferentially oriented in the (100) plane. Namely, as illustrated in FIG. 6, by varying the ratio of Zr/Ti, a large displacement can be obtained. However, even for the same variations of the crystalline orientation ratio, the variation in the displacement differs depending on the ratio of Zr/Ti.

Here, it can be seen from FIG. 6 that, for a composition ratio of Zr/Ti, as the ratio of Ti becomes large, the displacement characteristic becomes large. Accordingly, when the composition ratio Zr/Ti is represented by Ti/(Zr+Ti), the composition ratio Ti/(Zr+Ti) is preferably greater than or equal to 0.45 and less than or equal to 0.55; and more preferably greater than or equal to 0.48 and less than or equal to 0.52.

If the value of the ratio Ti/(Zr+Ti) is less than the lower limit value of the range, a sufficient displacement by the piezoelectric distortion and the rotational distortion may not be obtained. If the value of the ratio Ti/(Zr+Ti) is greater than the upper limit value of this range, a sufficient displacement by the piezoelectric distortion may not be obtained. As described above, it is preferable that a displacement of a domain be large. However, the plurality of piezoelectric elements in the liquid discharge head is cut out from a large wafer and the plurality of piezoelectric elements is to be used, so that a piezoelectric property tends to be lowered as the position approaches to the outer fringe portion.

Note that, among the film properties of the PZT, a variation in the PZT crystal orientation ratio affects the variation in the expansion and contraction displacement of the piezoelectric element.

Thus, in order to cause the plurality of piezoelectric elements to be operated with the same conditions, it is preferable that the displacement characteristic in the vicinity of the outer fringe portion of the wafer be almost equal to the displacement characteristic in the vicinity of the center of the wafer.

Figure 7A:
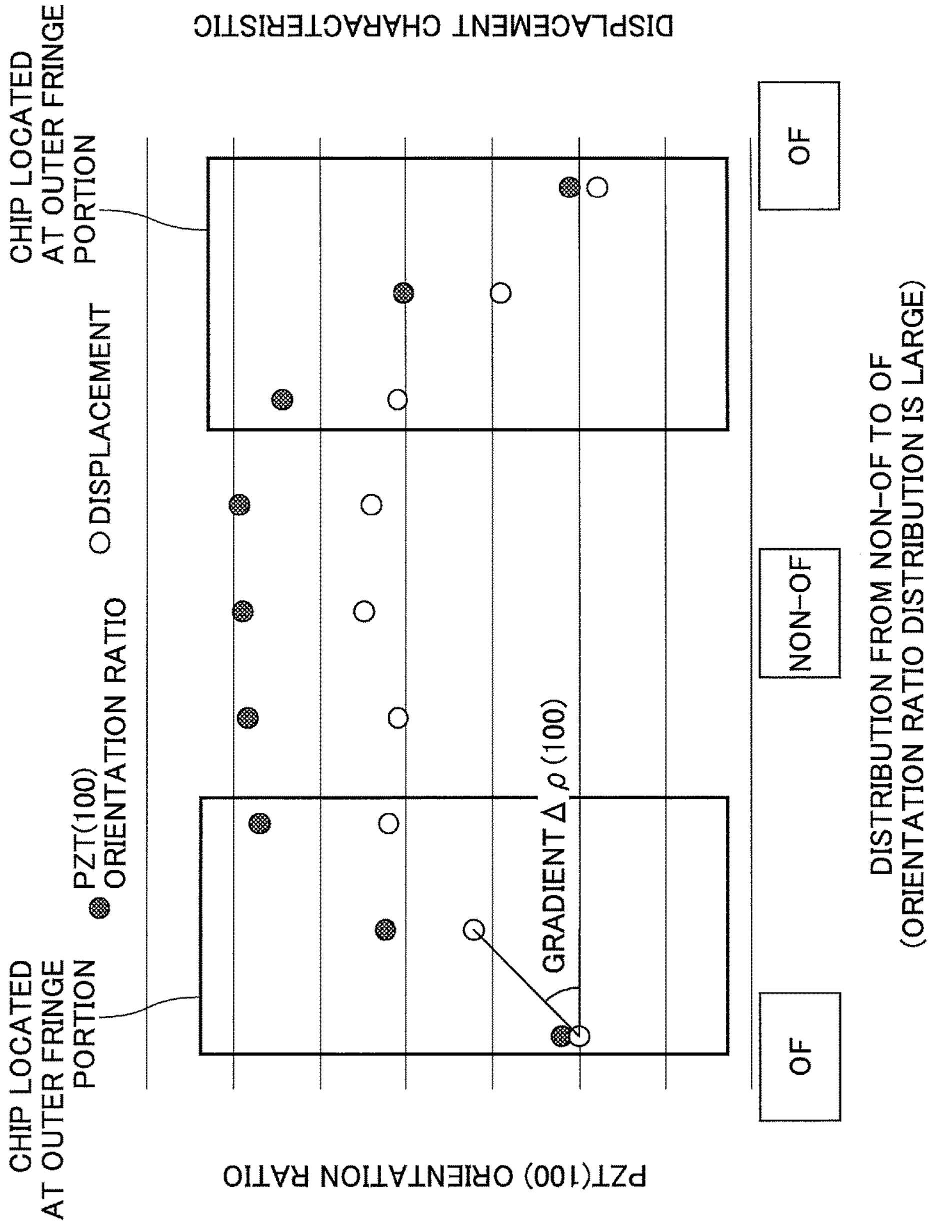
FIG. 7A is a diagram exemplifying a correlation between an orientation ratio distribution and the distribution of the displacement characteristic for a case where the orientation ratio distribution is large.
Figure 7B:
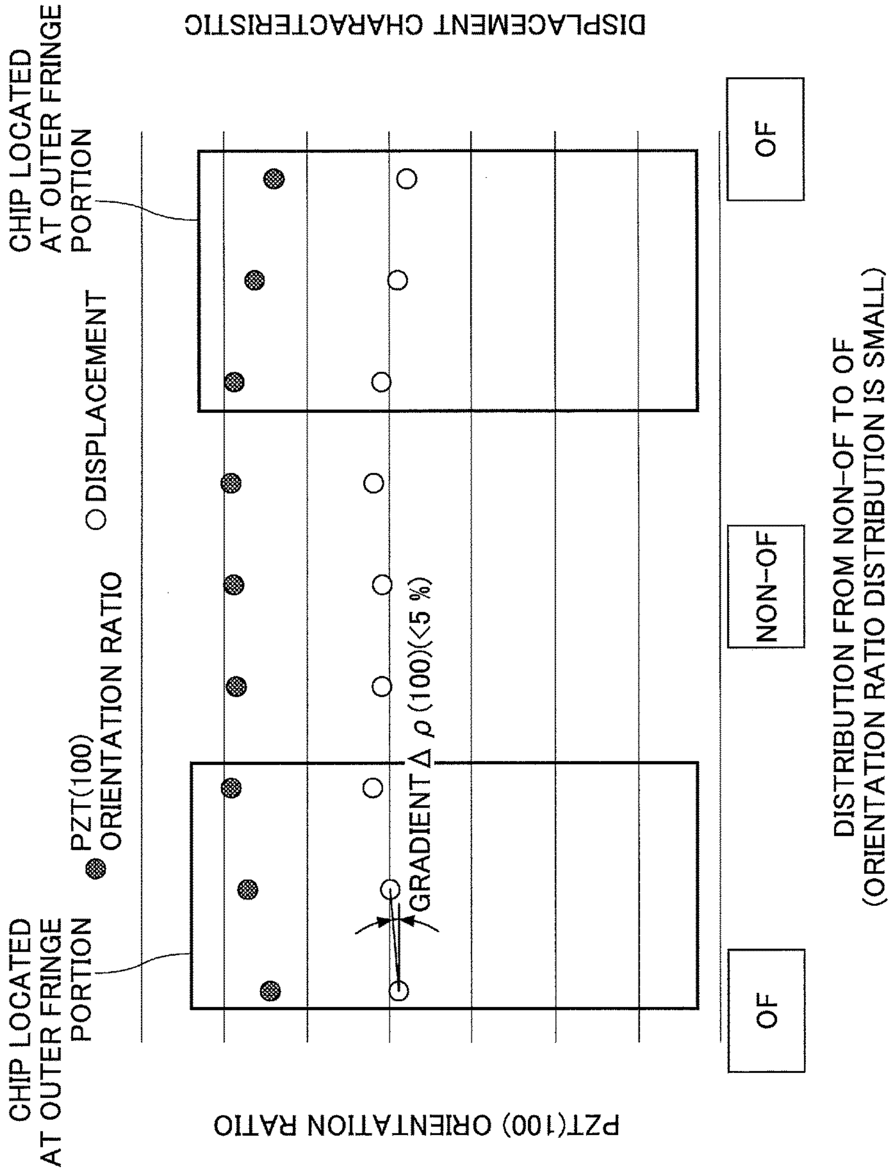
FIG. 7B is a diagram exemplifying the correlation between the orientation ratio distribution and the distribution of the displacement characteristic for a case where the orientation ratio distribution is small.

For example, in FIG. 7A and FIG. 7B, orientation ratio distributions are indicated for a case where an electromechanical transducer film is formed on a 6-inch waver. Here, at this state, the pressure chambers are not yet formed. After that, the pressure chambers are formed, and the displacement characteristics are measured. The distributions of the displacement characteristics are also indicated in FIG. 7A and FIG. 7B.

By comparing FIG. 7A with FIG. 7B, it can be seen that, for the wafer with a large variation in the orientation ratio of PZT (100) from the OF of the wafer (the vicinity of the outer fringe portion) to the non-OF of the wafer (the center portion), the variation in the domain displacement is also large (FIG. 7A). It can be seen that, for FIG. 7B for which the variation in the orientation ratio is small, the variation in the displacement is also small.

Here, the displacement characteristic itself also affects piezoelectric distortion that is affected by a film property of a piezoelectric material; a size of the pressure chamber, such as that of illustrated in FIG. 1; and a film thickness of each layer. Among the film properties, the orientation ratio of the PZT (100) that has a large contribution to the displacement is defined as follows. $\rho(hkl)=I(hkl)/\rho I(hkl)$, where $\rho(hkl)$ is a degree of orientation in an (hkl) plane orientation, I(hkl) is the peak intensity value of an orientation, and $\Sigma I(hkl)$ is the total of the peak intensity values. When a gradient in a direction of the sequence of the chips is denoted as $\Delta\rho(100)$, the gradient $\Delta\rho(100)$ is preferably less than or equal to 5%, as illustrated in FIG. 7B.

When the gradient of the orientation ratio is outside this range, the gradient of the displacement in the direction of the sequence of the chips becomes large, as illustrated in FIG. 7A. Thus, by aligning the displacement, the film properties of the piezoelectric material are equalized.

Furthermore, when an average of the orientation ratio of the PZT (100) plane orientation, namely, the ratio of the PZT (100) in the PZT crystal in the array direction is denoted as Ave_ρ(100), it is preferable that Ave_ρ(100) be greater than or equal to 95%. When Ave_ρ(100) is out of this range, a sufficient displacement may not be obtained.

From the above description, it can be seen that, in order to ensure a sufficient displacement characteristic and to sufficiently reduce the variation within the array of the chips, it is important to adjust the Zr/Ti ratio to be within the above-described optimum range of the Zr/Ti ratio, and to form a film that is highly preferentially oriented in the PZT (100) plane.

In order to obtain the film that is highly preferentially oriented in the PZT (100) plane, process conditions, such as temperature conditions and atmospheres of processes during formation of the PZT film by using the spin coating method, such as a drying process, a calcining process, and a baking process, are to be properly selected.

Furthermore, by forming, for controlling the orientation, a seed layer formed of lead titanate (PT) between the lower electrode 31 (electrode layer) and the electromechanical transducer film (PZT) 32, which are illustrated in FIG. 2, and by adjusting thickness of the PT seed layer to be greater than or equal to 1 nm and less than or equal to 20 nm, a film can be formed that is very highly preferentially oriented in the (100) plane.

By adjusting the thickness of the seed layer to be within this range, the variation in the orientation ratio within the wafer surface can be suppressed, and a favorable film that is preferentially oriented in the PZT (100) plane can be obtained.

In the embodiment of the present invention, depending on the state of the film thickness distribution of the oscillation plate, which is described below, the width of the liquid chamber at the outer fringe portion of the wafer is to be broadened, or to be narrowed. In order to adjust the width in this manner, adjustment of the width is performed by adjusting the width of a resist mask to be used for etching (from the stage of designing the mask, the width at the outer fringe portion of the wafer is to be broadened, or to be narrowed).

Furthermore, the width of the liquid chamber is preferably greater than or equal to 50 μm and less than or equal to 70 μm, and more preferably greater than or equal to 55 μm and less than or equal to 65 μm. If the value is greater than the upper limit value of the range, residual oscillation becomes large, and it becomes difficult to ensure the discharging performance at the high frequency. If the value is less than the lower limit value of the range, the displacement amount is reduced, and sufficient discharging pressure may not be ensured.

Furthermore, the variation in the width of the liquid chamber (especially, the variation in the size, such as the variation to form a slope on the wafer surface) affects the variation in the displacement and the variation in the discharging performance. Accordingly, it is preferable that the variation in the width of the liquid chamber be managed in the process, so that ΔL/Ave_L is within ±2.5%, where Ave_L is an average value of the lengths of the liquid chambers in the short direction, which is averaged over the array direction, and ΔL is a gradient in one direction.

Upon receiving the force generated by the electromechanical transducer film 30, which is illustrated in FIG. 1, the base (the oscillation plate 20) is deformed and displaced to discharge ink droplets from the pressure chamber 10*x*. Thus, it is preferable that the base has predetermined strength. As a material of the base (the oscillation plate 20), there are Si, $SiO_2$, and $Si_3N_4$, which may be formed by the CVD method. To ensure the stiffness of the base (the oscillation plate 20), the base may be formed of a plurality of laminated films including a film with high stiffness. In order to ensure the discharging performance at a high frequency, it may be required that the oscillation plate 20 has the Young's modulus that is greater than or equal to 75 GPa. If it is attempted to achieve this high stiffness only by a single layer, a large film thickness may be required. However, if the film thickness is large, peeling may occur. Thus, the stiffness can be adjusted by inserting a film with slightly lower stiffness between the layers.

Furthermore, it is preferable to select a material that has a linear expansion coefficient that is close to the linear expansion coefficients of the lower electrode 31 and the electromechanical transducer film 32, which are illustrated in FIG. 1. Especially, as a material of the electromechanical transducer film 32, PZT is used, in general. Thus, a material with a linear expansion coefficient from $5\times10^{-6}$ (1/K) through $10\times10^{-6}$ (1/K), which is close to the linear expansion coefficient of $8\times10^{-6}$ (1/K), is preferable; and a material with a linear expansion coefficient from $7\times10^{-6}$ (1/K) through $9\times10^{-6}$ (1/K) is more preferable.

As specific materials of the electromechanical transducer film 32, there are Aluminum oxide, Zirconium oxide, Iridium oxide, Ruthenium oxide, Tantalum oxide, Hafnium oxide, Osmium oxide, Rhenium oxide, Rhodium oxide, Palladium oxide, and a chemical compound of the above-described oxides. The electromechanical transducer film 32 can be formed of any of the above-described materials by using the sputtering method or the sol-gel method.

The film thickness of the electromechanical transducer film 32 is preferably from 1 μm through 3 μm; and more preferably from 1.5 μm through 2.5 μm. If the film thickness is less than the lower limit value of the range, it may be difficult to form the pressure chamber 10*x*, which is illustrated in FIG. 1. If the film thickness is greater than the upper limit value of the range, it becomes difficult for the oscillation plate 20 to be deformed and to be displaced, and discharging of ink droplets becomes unstable.

Furthermore, the variation in the film thickness of the oscillation plate 20 (especially, the variation in the film thickness, such as the variation to form a slope on the wafer surface) affects the variation in the displacement and the variation in the discharging performance. Accordingly, it is preferable that the variation in the film thickness of the oscillation plate 20 be managed in the process, so that $\Delta ds/Ave\_ds$ is within ±5%, where Ave_ds is an average film thickness of the total film thickness of the oscillation plate 20, which is averaged over the array direction, and Δds is a gradient of the total film thickness of the oscillation plate 20 in one direction.

As a metal material of the lower electrode 31 and the upper electrode 33, platinum has been used that has high heat resistance and low reactivity. However, platinum may not have sufficient barrier property for lead, so that platinum group elements, such as iridium and platinum-rhodium, and an alloy of these elements may be used, as the metal materials of the lower electrode 31 and the upper electrode 33. Furthermore, for a case of using platinum, it is preferable to laminate Ti, $TiO_2$, Ta, $Ta_2O_5$, and $Ta_3N_5$ in advance because the adhesiveness of the platinum to the oscillation plate 20 (especially, to $SiO_2$) is not favorable. As the manufacturing method of the lower electrode 31 and the upper electrode 33, in general, a vacuum film deposition method is used, such as the sputtering method and a vacuum evaporation method. The film thickness of the lower electrode 31 and the upper electrode 33 is preferable from 0.05 μm through 1 μm; and more preferably from 0.1 μm through 0.5 μm.

Furthermore, an oxide electrode film formed of a material, such as $SrRuO_3$ and $LaNiO_3$, may be formed between the above-described metal material and the electromechanical transducer film 32. Especially, the oxide electrode to be formed between the lower electrode 31 and the electromechanical transducer film 32 affects orientation control of the electromechanical transducer film 32 (e.g., the PZT film) to be formed on the oxide electrode, so that the material of the oxide electrode to be selected differs depending on the preferentially oriented direction.

In the embodiment, it is desirable that the electromechanical transducer film 32 is preferentially oriented in the PZT (100) plane. Thus, as the second electrode, a seed layer, such as $LaNiO_3$, $TiO_2$, and $PbTiO_3$, is formed on the first electrode, and then the PZT film is formed. As an oxide electrode between the upper electrode 33 and the electromechanical transducer film 32, SRO is used. The film thickness of the oxide electrode between the upper electrode 33 and the electromechanical transducer film 32 is preferably from 20 nm through 80 nm, and more preferably from 30 nm through 50 nm.

If the film thickness of the oxide electrode between the upper electrode 33 and the electromechanical transducer film 32 is less than the lower limit value of the above-described range, sufficient characteristics may not be obtained for the initial displacement and the displacement deterioration. If the film thickness of the oxide electrode between the upper electrode 33 and the electromechanical transducer film 32 is greater than the upper limit value of the above-described range, the dielectric breakdown voltage of the subsequently formed PZT film can be very unfavorable, and leakage tends to occur.

As the electromechanical transducer film 32, PZT was mainly used. PZT is a solid solution of lead zirconate ($PbZrO_3$) and titanic acid ($PbTiO_3$), and characteristics of PZT differs depending on a ratio between $PbTiO_3$ and $PbTiO_3$.

In general, a composition that exhibits a favorable piezoelectric property can be represented as 53:47, in terms of the ratio between $PbZrO_3$ and $PbTiO_3$. The composition may be represented by a chemical formula $Pb(Zr_{0.53},Ti_{0.47})O_3$ or $PZT_{(53/47)}$. As a composite oxide other than PZT, there is barium titanate. In this case, a barium titanate precursor solution can be obtained by using a chemical compound of barium alkoxide and titanium alkoxide, as a starting material, and by dissolving the start material in a common solvent.

However, for a case where the electromechanical transducer film 32 is to be preferentially oriented in the PZT (100) plane, as described above, when the composition ratio Zr/Ti is represented by Ti/(Zr+Ti), it is preferable that Ti/(Zr+Ti) be greater than or equal to 0.45 and less than or equal to 0.55, and more preferably greater than or equal to 0.48 and less than or equal to 0.52.

In the embodiment, it is preferable that the electromechanical transducer film 32 be preferentially oriented in the PZT (100) plane. In a crystalline orientation of the electromechanical transducer film 32, an orientation ratio of a (100) plane orientation is preferably greater than or equal to 0.95; and more preferably greater than or equal to 0.99. Here, the orientation ratio of the (100) plane orientation is calculated based on a ratio of a peak intensity value of each orientation when a total of the peak intensity values obtained by θ-2θ measurement of an X-ray diffraction method is set to be 1. The peak intensity value of each orientation is represented by $\rho(hkl)=I(hkl)/\Sigma I(hkl)$, where ρ(hkl) is a degree of orientation in an (hkl) plane orientation, I(hkl) is the peak intensity value of the orientation, and ΣI(hkl) is the total of the peak intensity values. If the orientation ratio of the (100) plane orientation is less than 0.95, sufficient piezoelectric distortion may not be obtained, so that a sufficient deformation amount may not be ensured.

These materials are represented by a general formula $ABO_3$, which correspond to complex oxides including A=Pb, Ba, or Sr, as a main component; and B=Ti, Zr, Sn, Ni, Zn, Mg, or Nb, as another main component. As specific examples, there are (Pb1-x, Ba) $(Zr, Ti)O_3$ and (Pb1-x, Sr) $(Zr, Ti)O_3$. Here, Pb at the A site is partially substituted by Ba or Sr. Such a substitution can be made as long as the element is a divalent element. The effect of the substitution is to reduce deterioration of characteristics by evaporation of lead during thermal processing.

The electromechanical transducer film 32 can be produced by a spin coater by using the sputtering method or the sol-gel method. In this case, patterning is required. By photolithoetching, a desired pattern can be obtained.

For a case of forming PZT by the sol-gel method, a PZT precursor solution can be obtained by preparing, as a starting material, a chemical compound of lead acetate, zirconium alkoxide, and titanium alkoxide; and by dissolving the starting material in methoxyethanol, as a common solvent, to obtain a homogeneous solution. A metal alkoxide compound can be easily hydrolyzed by moisture in the atmosphere. Thus, an appropriate amount of a stabilizer, such as acetylacetone, acetic acid, and diethanolamine, can be added to the precursor solution.

For the case of obtaining a PZT film on the entire surface of the base substrate, a coating film is formed by a solution coating method, such as a spin coating method; and the PZT film is obtained by applying the thermal processing including a solvent drying process, a thermal decomposition process, and a crystallization process. When a coating film transforms into a crystallized film, the volume of the film shrinks. In order to obtain a crack-free film, the precursor concentration can be adjusted, so that a film with a thickness of less than or equal to 100 nm can be obtained in a single process.

Figure 8A:
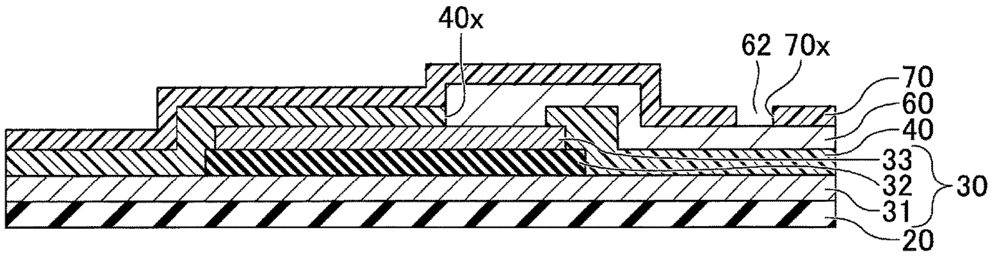
FIG. 8A is a diagram exemplifying wiring of the liquid discharge head according to the embodiment.
Figure 8B:
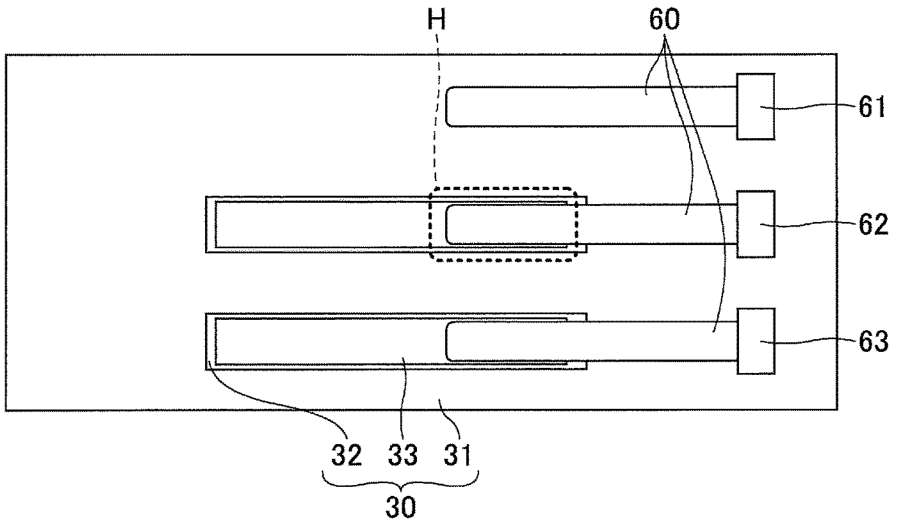
FIG. 8B is a diagram exemplifying the wiring of the liquid discharge head according to the embodiment.

FIGS. 8A and 8B illustrate a configuration of the electromechanical transducer element 30 including the insulation and protection film 40, and lead-out wiring. A first insulation and protection film is provided with contact halls, first and second electrodes are electrically conducted to a fifth electrode; and third and fourth electrodes are electrically conducted to a sixth electrode. Here, a second insulation and protection film is formed to protect a common electrode, which is the fifth electrode, and an individual electrode, which is the sixth electrode. An opening is formed at a part of the second insulation and protection film to form an electrode pad. Note that the electrode pad formed for the common electrode is a common electrode pad, and the electrode pad formed for the individual electrode is an individual electrode pad.

Here, a configuration of the liquid discharge head including wiring is described. FIGS. 8A and 8B are diagrams exemplifying wiring of the liquid discharge head according to the embodiment. FIG. 8A is a cross-sectional side view, and FIG. 8B is a plan view. In FIG. 8B, depiction of the insulation and protection films 40 and 70 is omitted.

Referring to FIGS. 8A and 8B, a plurality of wires 60 is formed on the insulation and protection film 40; and the insulation and protection film 70 is further formed on the wires 60. The insulation and protection film 40 includes a plurality of openings 40*x*. In each opening 40*x*, the lower electrode 31 or the upper electrode 33 is exposed. The wires 60 includes a wire that is coupled to the upper electrode 33 while filling one of the openings 40*x* (the portion of the contact hole H of FIG. 8B), and a wire that is coupled to the lower electrode 31 while filing another one of the openings 40*x*.

The insulation and protection film 70 includes a plurality of openings 70*x*. In each opening 70, a surface of the corresponding wire 60 is exposed. The wires 60 exposed in the corresponding openings 70*x* form electrode pads 61, 62, and 63, respectively. Here, the electrode pad 61 is a common electrode pad. The electrode pad 61 is coupled to the lower electrode 31 through the wire 60. Here, the lower electrode 31 is common among the electromechanical transducer elements 30. The electrode pads 62 and 63 are individual electrode pads. The electrode pads 62 and 63 are respectively connected to the upper electrodes 33 through the wires 60. Here, the upper electrodes 33 are individually provided for the corresponding electromechanical transducer elements 30.

Figure 9:
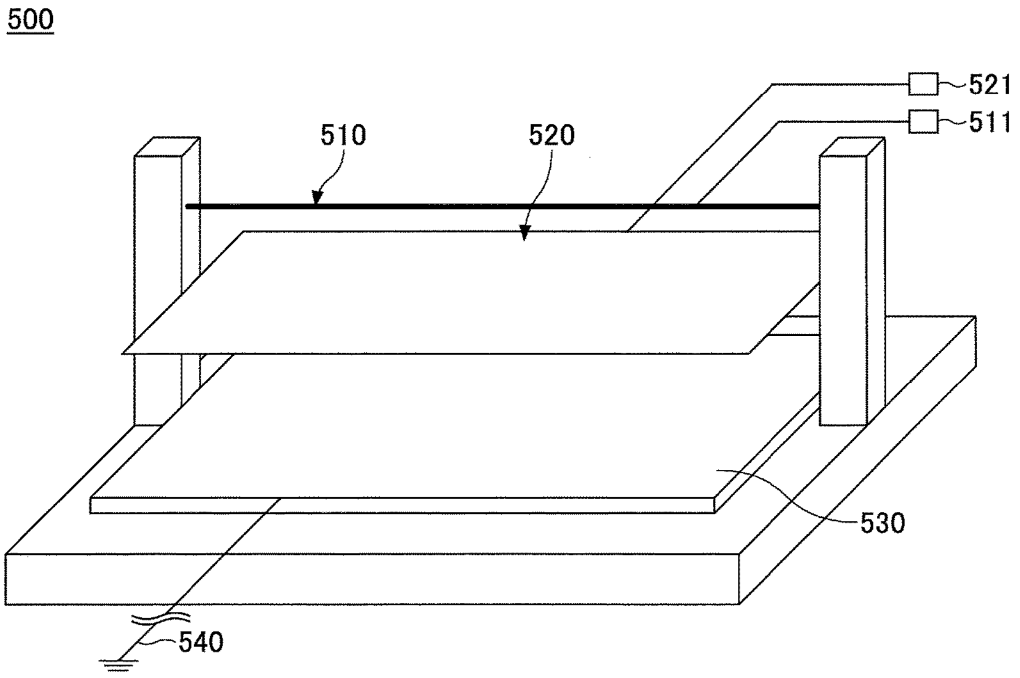
FIG. 9 is a diagram exemplifying a schematic configuration of a polarization processing device.

Next, a polarization processing device is described. FIG. 9 is a diagram exemplifying a schematic configuration of a polarization processing device. The polarization processing device includes a corona electrode 510; and a grid electrode 520. The corona electrode 510 is coupled to a corona electrode power supply 511. The grid electrode 520 is coupled to a grid electrode power supply 521. A stage 530 for setting a sample is provided with a temperature control function. Polarization process can be performed while adjusting the temperature to be up to 350° C. The stage 530 is provided with a ground 540. Without the ground 540, polarization process may not be performed.

For example, mesh processing is applied to the grid electrode 520, so that, when a high voltage is applied to the corona electrode 510, ions and charges generated by corona discharging are efficiently fallen onto the stage 530 to be injected into the electromechanical transducer film 32. The strength of corona discharging can be adjusted by adjusting the magnitude of the voltage applied to the corona electrode 510 or the grid electrode 520, or by adjusting the distance between the sample and the electrodes.

Figure 10:
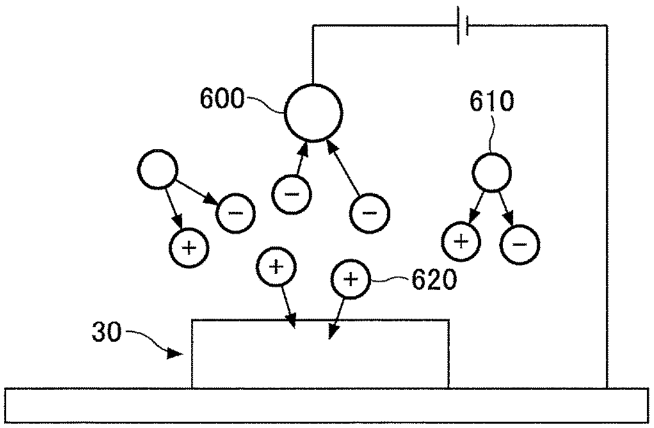
FIG. 10 is a diagram illustrating corona discharge.

FIG. 10 is a diagram illustrating the corona discharging. As illustrated in FIG. 10, when corona discharging is to be performed by using a corona wire 600, molecules 610 in the atmosphere are ionized to generate cations 620. Then, the generated cations 620 flow into the electromechanical transducer element 30 through the pads of the electromechanical transducer element 30. In this manner, charges can be injected into the electromechanical transducer element 30.

In this case, it is considered that an internal potential difference is generated by an electric charge difference between the lower electrode 31 and the upper electrode 33, and, consequently, the polarization process is performed. At this time, an electric charge amount Q required for performing the polarization process is not particularly limited. However, an electric charge amount to be stored in the electromechanical transducer element 30 is preferably greater than or equal to $1.0\times10^{-8}$ C; and more preferably greater than or equal to $4.0\times10^{-8}$ C. If the electric charge amount to be stored in the electromechanical transducer element 30 is less than the above-described value, sufficient polarization process may not be performed, and sufficient characteristics may not be obtained for displacement deterioration after continuous driving as a PZT piezoelectric actuator.

Figure 11A:
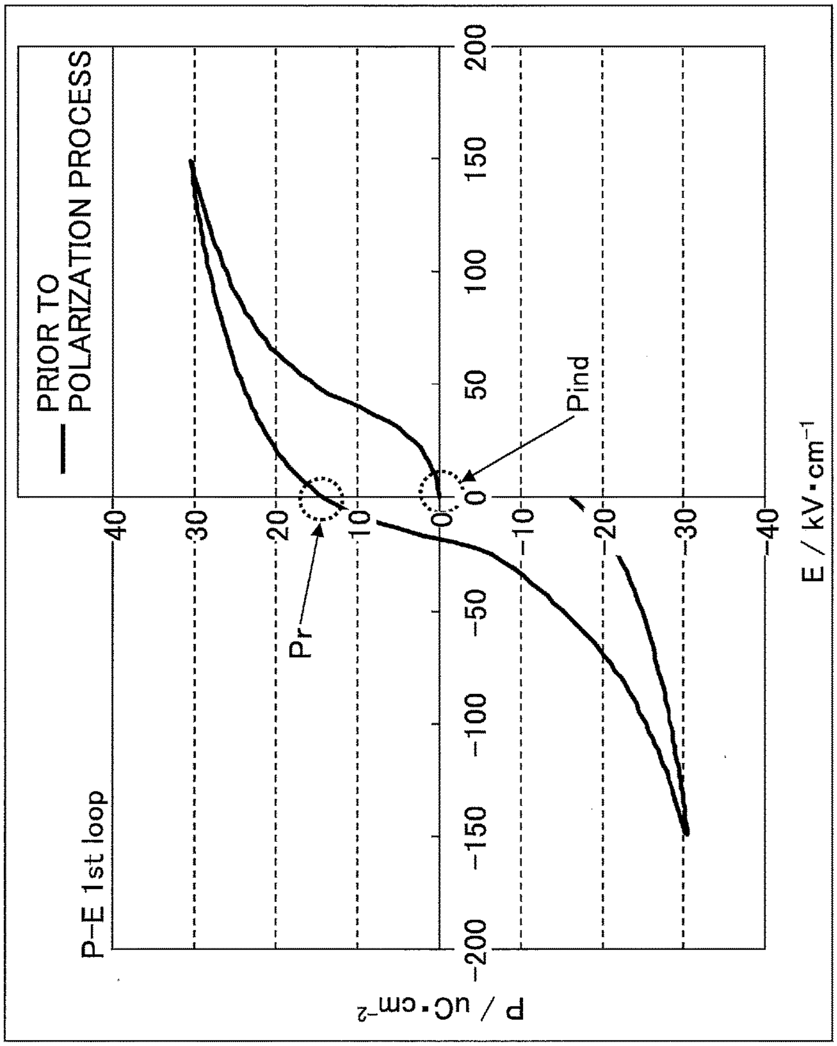
FIG. 11A is a diagram exemplifying a P-E hysteresis loop.
Figure 11B:
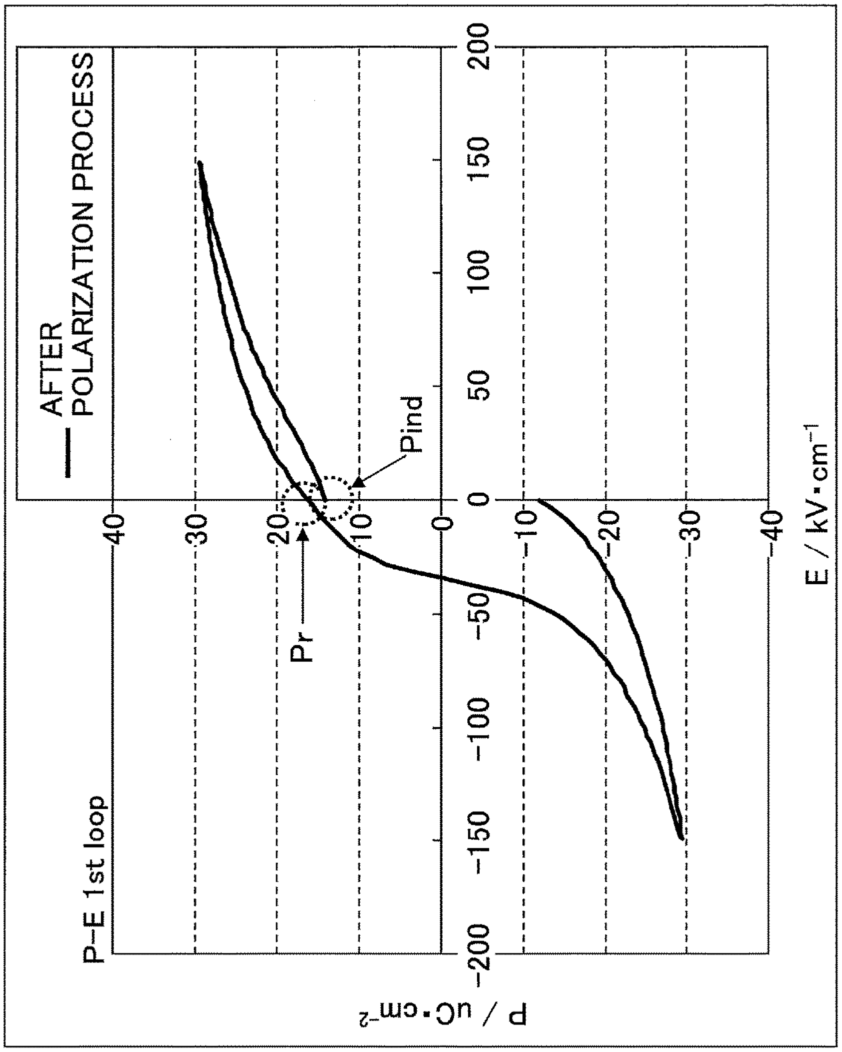
FIG. 11B is a diagram exemplifying the P-E hysteresis loop.

Here, the state of the polarization process can be determined from a P-E hysteresis loop of the electromechanical transducer element 30. A method of determining the state of the polarization process is described by referring to FIGS. 11A and 11B. FIG. 11A exemplifies the P-E hysteresis loop prior to the polarization process. FIG. 11B exemplifies the P-E hysteresis loop after the polarization process.

Specifically, first, a hysteresis loop is measured by applying an electric field strength of ±150 kV/cm, as illustrated in FIGS. 11A and 11B.

When polarization at the initial 0 kV/cm is denoted by Pind and polarization at 0 kV/cm after applying the voltage of +150 kV/cm and returning to 0 kV/cm is denoted by Pr, the polarizability is defined to be a value of Pr−Pind. Based on this polarizability, favorability of a polarization state can be determined.

The polarizability Pr−Pind is preferably less than or equal to 10 $\mu C/cm^2$; and more preferably less than or equal to 5 $\mu C/cm^2$. If the polarizability Pr−Pind is greater than 10 $\mu C/cm^2$, sufficient characteristics may not be obtained for displacement deterioration after continuous driving as a PZT piezoelectric actuator.

Note that, desired polarizability Pr−Pind can be obtained by adjusting the voltages of the corona electrode 510 and the grid electrode 520, and by adjusting the distance between the stage 530 and the corona electrode 510 and the distance between the stage 530 and the grid electrode 520 in FIG. 9, in the polarization processing device 500 illustrated in FIG. 9. However, when an attempt is made to obtain desired polarizability Pr−Pind, it is preferable to generate a high electric field with respect to the electromechanical transducer film 32.

As an application, a liquid discharge device including the liquid discharge head 2 (cf. FIG. 3) is exemplified. The liquid discharge device according to the embodiment relates to a field of printing, specifically, a field of digital printing and a three-dimensional shaping technique using inkjet technology.

Figure 12:
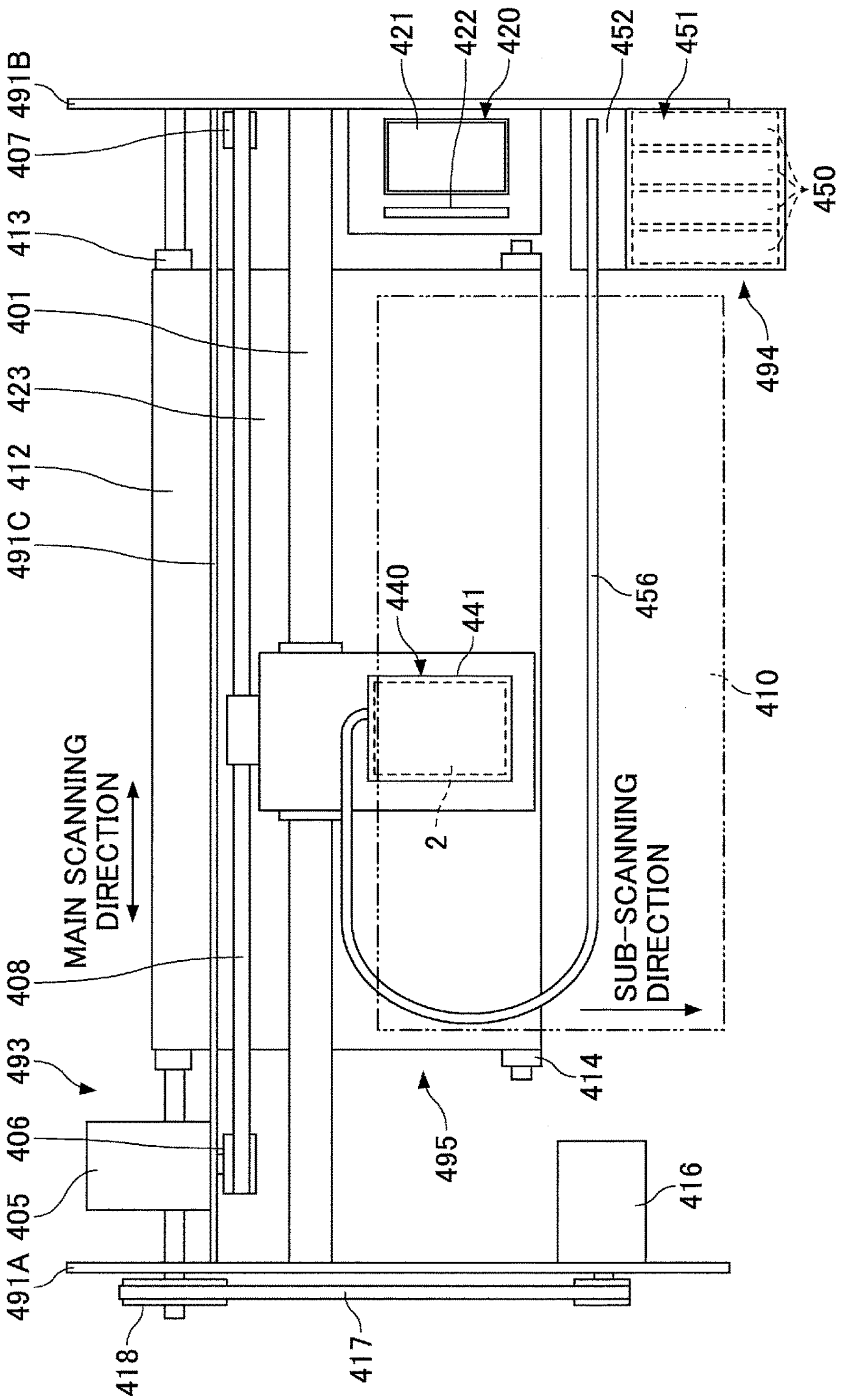
FIG. 12 is a plan view illustrating main parts of an example of a liquid discharge device according to the embodiment.
Figure 13:
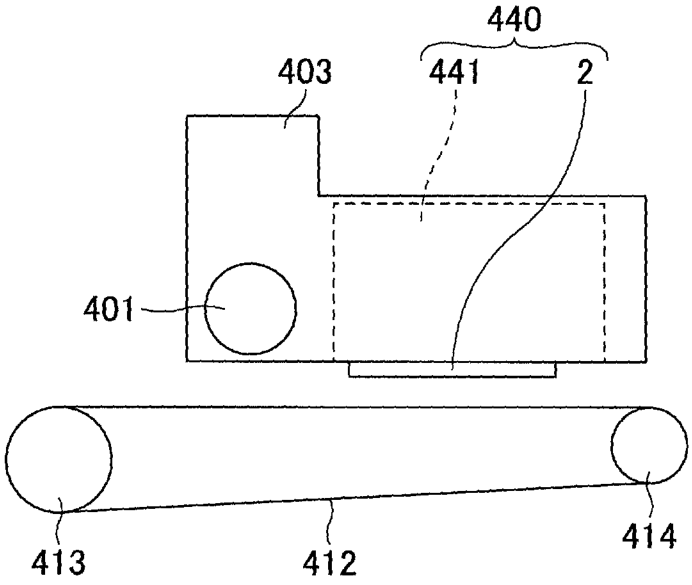
FIG. 13 is a side view illustrating the main parts of the example of the liquid discharge device according to the embodiment.

First, an example of the liquid discharge device according to the embodiment is described by referring to FIG. 12 and FIG. 13. FIG. 12 is a plan view illustrating main parts of the example of the liquid discharge device. FIG. 13 is a side view illustrating the main parts of the example of the liquid discharge device.

The liquid discharge device is a serial device. A main scanning moving mechanism 493 causes a carriage 403 to reciprocate in a main scanning direction. The main scanning moving mechanism 493 includes a guide member 401; a main scanning motor 405; and a timing belt 408. The guide member 401 is bridged between left and right side plates 491A and 491B so as to movably hold the carriage 403. The carriage 403 is caused to reciprocate in the main scanning direction by the main scanning motor 405 through the timing belt 408 stretched between a driving pulley 406 and a driven pulley 407.

In the carriage 403, a liquid discharge unit 440 is installed that integrates the liquid discharge head 2 according to the embodiment and a head tank 441. The liquid discharge head 2 of the liquid discharge unit 440 discharges, for example, yellow (Y) liquid, cyan (C) liquid, magenta (M) liquid, and black (K) liquid. Additionally, in the liquid discharge head 2, nozzle sequences formed of a plurality of nozzles 51 are arrayed in a sub-scanning direction perpendicular to the main scanning direction. The liquid discharge head 2 is installed in the carriage 403 in such a manner that the discharging direction is directed downward.

By a supply mechanism 494 for supplying, to the liquid discharge head 2, a liquid stored outside the liquid discharge head 2, the liquid stored in a liquid cartridge 450 is supplied to the head tank 441.

The supply mechanism 494 includes a cartridge holder 451 that is a filling member for installing the liquid cartridge 450; a tube 456; and a liquid feeding unit 452 including a liquid feeding pump. The liquid cartridge 450 is detachably attached to the cartridge holder 451. A liquid is fed from the liquid cartridge 450 to the head tank 441 by the liquid feeding unit 452 through the tube 456.

The liquid discharge device is provided with a feeding mechanism 495 for feeding a paper sheet 410. The feeding mechanism 495 includes a feeding belt 412; and a sub-scanning motor 416 for driving the feeding belt 412.

The feed belt 412 attracts the paper sheet 410, and the feed belt 412 conveys the paper sheet 410 at a position facing the liquid discharge head 2. The feed belt 412 is an endless belt; and the feed belt 412 is stretched between a feed roller 413 and a tension roller 414. The attraction can be achieved by using electrostatic attraction or air suction.

The feeding belt 412 is caused to be rotated in the sub-scanning direction by rotational driving of the feed roller 413 by the sub-scanning motor 416 through the timing belt 417 and a timing pulley 418.

Furthermore, on one side of the carriage 403 in the main scanning direction, a maintenance/recovery mechanism 420 for maintaining and recovering the liquid discharge head 2 is arranged at the side of the transport belt 412.

The maintenance/recovery mechanism 420 includes, for example, a cap member 421 for capping a nozzle surface (the surface on which the nozzles 51 are formed) of the liquid discharge head 2; and a wiper member 422 for wiping the nozzle surface.

The main scanning moving mechanism 493, the supply mechanism 494, the maintenance/recovery mechanism 420, and the feeding mechanism 495 are attached to a housing including the side plates 491A and 491B, and a back plate 491.

In the liquid discharge device configured as described above, the paper sheet 410 is fed and attracted on the feeding belt 412, and the paper sheet 410 is conveyed in the sub-scanning direction by rotational movement of the feeding belt 412.

By driving the liquid discharge head 2 in accordance with an image signal while moving the carriage 403 in the main scanning direction, a liquid is discharged onto the stopped paper sheet 410, and thereby an image can be formed.

In this manner, the liquid discharge device is provided with the liquid discharge head 2 according to the embodiment, high-quality images can be stably formed.

Figure 14:
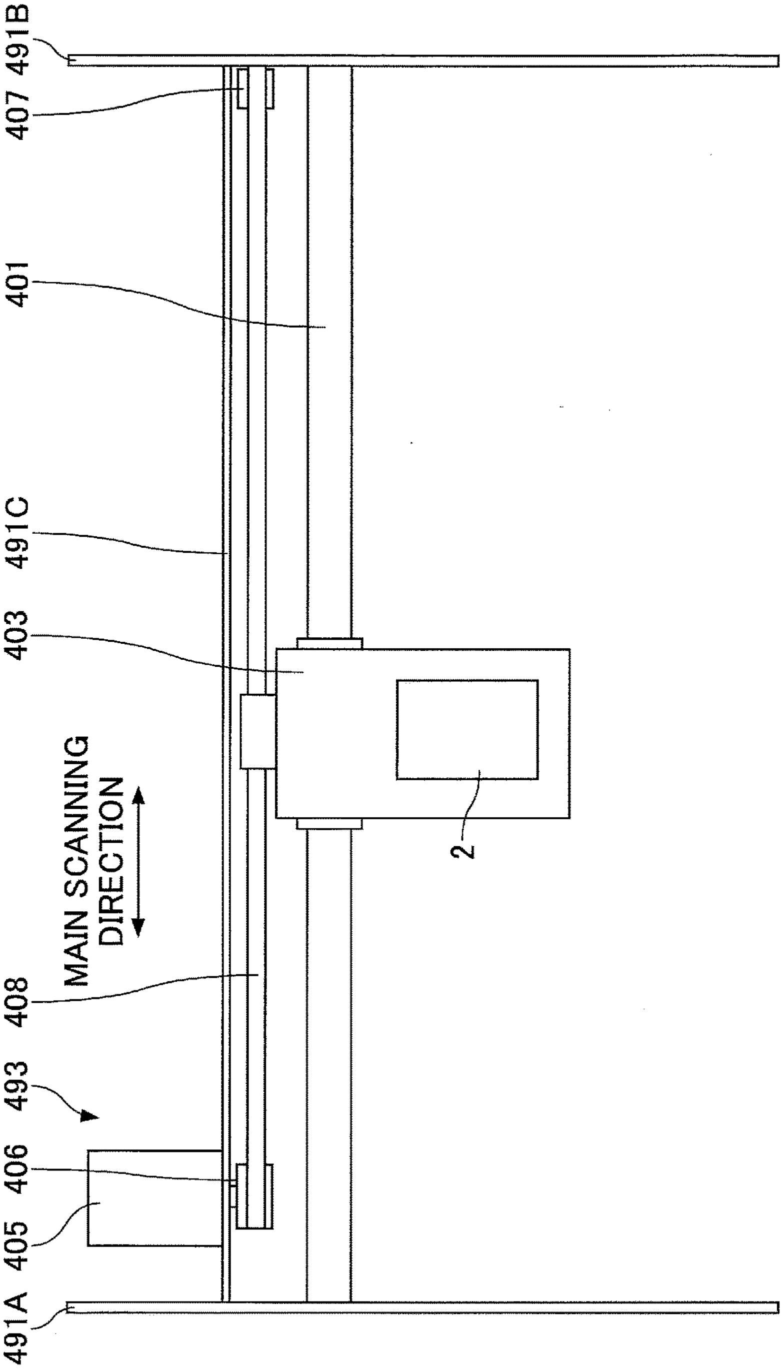
FIG. 14 is a plan view illustrating main parts of another example of a liquid discharge unit according to the embodiment.

Next, another example of the liquid discharge unit 440 according to the embodiment is described by referring to FIG. 14. FIG. 14 is a plan view illustrating the main parts of the liquid discharge unit 440.

The liquid discharge unit 440 includes, among the components forming the above-described liquid discharge device, the housing formed of the side plates 491A and 491B, and the back plate 491C; the main scanning moving mechanism 493; the carriage 403; and the liquid discharge head 2.

Here, at least one of the above-described maintenance/recovery mechanism 420 and the supply mechanism 494 may be attached, for example, to the side plate 491B of the liquid discharge unit 440.

Figure 15:
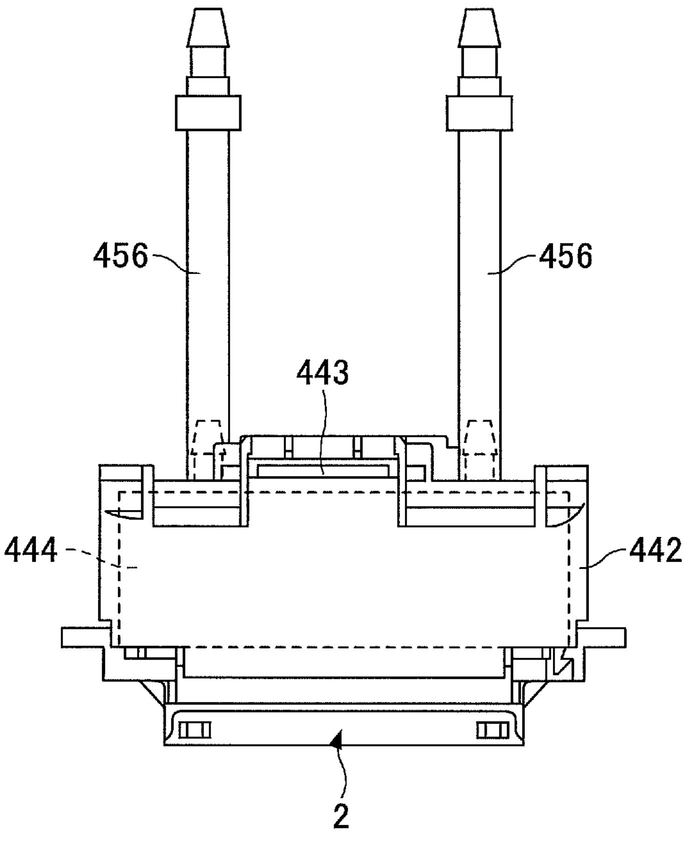
FIG. 15 is a front view illustrating yet another example of the liquid discharge unit according to the embodiment.

Next, a further example of the liquid discharge unit 440 is described by referring to FIG. 15. FIG. 15 is a front view illustrating the further example of the liquid discharge unit 440.

The liquid discharge unit 440 includes the liquid discharge head 2 to which a flow channel component 444 is attached; and the tubes 456 connected to the flow channel component 444.

Here, the flow channel component 444 is disposed inside a cover 442. Instead of the flow channel component 444, the head tank 441 may be included in the liquid discharge unit 440. Furthermore, at the upper portion of the flow channel component 444, a connector 443 is provided, which is for establishing electrical coupling with the liquid discharge head 2.

In the present application, "the liquid discharge device" is a device that includes a liquid discharge head or a liquid discharge unit, and that discharges a liquid by driving the liquid discharge head or the liquid discharge unit. The liquid discharge device includes, not only the device that discharges a liquid to an object to which the liquid can be adhered, but also a device that discharges a liquid toward air or toward a solution.

The "liquid discharge device" may include, in addition to a unit for feeding, conveying, and ejecting an object to which the liquid can be adhered, a preprocessing device, and a post-processing device.

For example, as the "liquid discharge device" there are an image forming device that forms an image on a paper sheet by discharging ink; and a stereoscopic molding device (a three-dimensional molding device) that discharges a shaping liquid to a powder layer formed by shaping powder in a layered form so as to shape a stereoscopic object (three-dimensional object).

Furthermore, the "liquid discharge device" is not limited to the device that can visualize, by the discharged liquid, an image with meaning, such as a character and a figure. Examples of the "liquid discharge device" include a device that forms a pattern that does not have meaning by itself; and a device that forms a three-dimensional image. The above-described "object to which the liquid can be adhered" means an object to which the liquid can be adhered at least temporarily, an object to which the liquid is adhered and fixed, and an object to which the liquid is adhered and percolated. As specific examples, there are a recording medium, such as a paper sheet a recording sheet, a recording paper sheet, a film, and a cloth; and a medium such as an electronic substrate, an electronic component, e.g., a piezoelectric element, a powder bed (powder layer), an organ model, and a test cell. Unless as specified otherwise, the "object to which the liquid can be adhered" includes everything to which liquid can be adhered.

The material of the "object to which the liquid can be adhered" may be any material to which a liquid can be adhered at least temporarily, such as paper, thread, fiber, cloth, leather, metal, plastic, glass, wood, and ceramics.

Furthermore, examples of the "liquid" include ink; a processing liquid; a DNA sample; a resist; a pattern material; a binding agent; a shaping liquid; and a solution and a dispersing liquid including amino acid, protein, and calcium.

Furthermore, as an example of the "liquid discharge device," there is a device in which a liquid discharge head and an object to which the liquid can be adhered relatively move. However, the "liquid discharge device" is not limited to this. As specific examples, there are a serial device in which the liquid discharge head is moved; and a line device in which the liquid discharge head does not move.

Furthermore, as examples of the "liquid discharge device," there are a processing liquid application device that discharges a processing liquid onto a paper sheet so as to apply the processing liquid onto the surface of the paper sheet to modify the surface of the paper sheet; and an injection granulator for granulating fine particles of a raw material by injecting, through a nozzle, a composition liquid which is formed by dispersing the raw material in a solution.

The "liquid discharge unit" is a unit formed of a liquid discharge head by integrating functional components and mechanisms; and the "liquid discharge unit" is an assembly of components related to discharging the liquid. For example, the "liquid discharge unit" includes a unit formed by combining the liquid discharge head and at least one of the head tank, the carriage, the supply mechanism, the maintenance/recovery mechanism, and the main scanning moving mechanism.

Here, examples of the integrated component include, for example, a unit in which the liquid discharge head, the functional components, and the mechanisms are fixed to each other by fastening, adhesion, and engagement; and a unit in which a component is movably held with respect to another component. Furthermore, the liquid discharge head, the functional components, and the mechanisms may be formed to be mutually detachable.

For example, there is a liquid discharge unit in which a liquid discharge head and a head tank are integrated, such as the liquid discharge unit 440 illustrated in FIG. 13. Furthermore, there is a liquid discharge unit in which a liquid discharge head and a head tank are integrated by mutually connecting the liquid discharge head and the head tank through a tube. Here, between the head tank and the liquid discharge head of the liquid discharge unit, a unit including a filter may be added.

Furthermore, as the liquid discharge unit, there is a liquid discharge unit in which a liquid discharge head and a carriage are integrated.

Furthermore, as the liquid discharge unit, there is a liquid discharge unit in which a liquid discharge head and a scanning moving mechanism are integrated by movably holding the liquid discharge head by a guide member forming a part of the scanning moving mechanism. Furthermore, as illustrated in FIG. 15, there is a liquid discharge unit in which a liquid discharge head, a carriage, and a main scanning moving mechanism are integrated.

Furthermore, there is a liquid discharge unit in which a liquid discharge head, a carriage, and a maintenance/recovery mechanism are integrated by securing a cap member, which is a part of the maintenance/recovery mechanism, to the carriage to which the liquid discharge head is attached.

Furthermore, there is a liquid discharge unit in which a liquid discharge head and a supply mechanism are integrated by connecting a tube to a head tank or to the liquid discharge head to which a flow channel component is attached, as illustrated in FIG. 15.

The main scanning moving mechanism also includes a guide member along. Furthermore, the supply mechanism also includes a tube alone, and a filling member along.

Further, in the "liquid discharge head," a pressure generator to be used is not limited. For example, in addition to the piezoelectric actuator in the above-described embodiment (which may be a piezoelectric actuator using a laminated piezoelectric element), the "liquid discharge head" may include a thermal actuator using an electrothermal transducer, such as a heating resistor; or an electrostatic actuator formed of an oscillation plate and a counter electrode.

Furthermore, in the terms of the present application, image formation, recording, typing, copying, printing, and shaping are deemed to be synonymous.

In the embodiment of the present invention, by optimizing a Zr/Ti ratio in a PZT film, and by controlling a film thickness of a seed layer for reducing the variation in the orientation ratio of PZT (100), a high displacement characteristic for enhancing discharging performance can be obtained, and at the same time, a variation in printing during discharging can be reduced. Therefore, in the liquid discharging (injecting) head and the liquid discharging device (the image forming device), stable ink discharging performance can be obtained.

EXAMPLES

Examples of the present invention are described below.

Example 1

An oscillation plate was formed by laminating $SiO_2$ (film thickness: 600 nm), Si (film thickness 200 nm), $SiO_2$ (film thickness 100 nm), SiN (film thickness 150 nm), $SiO_2$ (film thickness 130 nm), SiN (film thickness 150 nm), $SiO_2$ (film thickness 100 nm), Si (200 nm), and $SiO_2$ (film thickness 600 nm) on a 6-inch wafer in this order.

At this time, from the stiffness and the film thickness of each layer, the equivalent Young's modulus for the total thickness was calculated. Furthermore, the film thickness distribution of SiN was measured for which the highest stiffness was obtained as a single layer, and the film thickness distribution for the total thickness was measured.

After that, a titanium film (film thickness: 20 nm) was formed as an adhesion film of the first and second electrodes at a film formation temperature of 350° C. by using a sputtering device. Then, a thermal oxidation process was performed at 750° C. by using rapid thermal annealing (RTA). Subsequently, a platinum film (film thickness: 160 nm) was formed as a metal film at a film formation temperature of 300° C. by using the sputtering device.

Next, a solution was prepared which was adjusted so that Pb:Ti=1:1, and a film was formed as a PbTiO3 layer that was to be a base layer by the spin coating method. Furthermore, a solution was prepared which was adjusted so that Pb:Zr:Ti=115:49:51, and a film was formed as an electromechanical transducer film by the spin coating method.

For the synthesis of the precursor coating solution, lead acetate trihydrate, isopropoxide titanium, and isopropoxide zirconium were used as a starting material. Crystal water of lead acetate was dissolved in methoxyethanol and dehydrated. An amount of lead was adjusted to exceed the amount defined by a stoichiometric composition. That was for preventing deterioration of crystallinity due to so-called escaping of lead during thermal processing.

Isopropoxide titanium and isopropoxide zirconium were dissolved in methoxyethanol, and alcohol exchange reaction and esterification reaction were proceeded. The resultant solution was mixed with the above-described methoxyethanol solution in which lead acetate was dissolved, and thereby the PZT precursor solution was synthesized.

The PZT concentration was adjusted to be 0.5 mol/L. The PT precursor solution was prepared in the same manner as the PZT precursor solution. By using these solutions, first a PT layer (film thickness 7 nm) was formed by the spin coating method, and, after forming the film, the film was dried at 120° C. Then, a PZT layer was formed by the spin coating method, and the film was dried at 120° C. After that, a thermal decomposition process was performed at 400° C. After performing the thermal decomposition process for the third layer, crystallization thermal processing (temperature: 730° C.) was performed by using the rapid thermal annealing (RTA). At this time, the film thickness of the PZT film was 240 nm. By performing this process 8 times (24 layers) in total, a PZT film with a thickness of approximately 2 μm was obtained.

Next, as the oxide film of the third and fourth electrodes, a SrRuO3 film (film thickness: 40 nm) was formed by the sputtering method. Furthermore, as the metal film, a Pt film (film thickness: 125 nm) was formed by the sputtering method. After that, a photoresist (TSMR-8800, manufactured by TOKYO OHKA KOGYO CO., LTD.) was formed by the spin coating method, and a resist pattern was formed by usual photolithography. Then, by using an ICP etching device (manufactured by Samco Inc.), a pattern was formed, such as that of illustrated in FIGS. 8A and 8B.

Next, as the first insulation and protection film, an $AL_2O_3$ with a film thickness of 50 nm was formed by using the ALD method. At this time, as raw materials, TMA (Sigma Aldrich Co.), as Al (aluminum), and $O_3$ generated by an ozone generator, as O (oxygen), were alternately laminated, and film formation was progressed. After that, as illustrated in FIG. 8, the contact hole portions were formed by etching.

After that, as the fifth and sixth electrodes, Al films were formed by the sputtering method, and patterns were formed by etching. As the second insulation and protection film, a film of Si3N4 with a thickness of 500 nm was formed by the plasma CVD method, and thereby the electromechanical transducer film was formed.

After that, the polarization process was performed by performing the corona discharging process. For the corona discharging process, a tungsten wire with a diameter of 50 μm was used. The processing conditions of the polarization process were as follows: the processing temperature was 80° C.; the corona voltage was 9 kV; the grid voltage was 2.5 kV; the processing time was 30 seconds; the distance between the corona electrode and the grid electrode was 4 mm; and the distance between the grid electrode and the stage was 4 mm.

Furthermore, a common electrode and individual electrode pads were formed to be coupled to the fifth and sixth electrodes. The distance between the individual electrode pads was 80 μm.

After that, as illustrated in FIG. 1, Si on the back surface was etched to produce the electromechanical transducer element in which the pressure chamber (width: 60 μm) was formed.

Example 2

The electromechanical transducer element was formed under the conditions that were the same as the conditions of example 1, except that a solution was prepared that was adjusted so that Pb:Zr:Ti=115:45:55, and the electromechanical transducer film was formed by the spin coating method.

Example 3

The electromechanical transducer element was formed under the conditions that were the same as the conditions of example 1, except that a solution was prepared that was adjusted so that Pb:Zr:Ti=115:55:45, and the electromechanical transducer film was formed by the spin coating method.

Example 4

The electromechanical transducer element was formed under the conditions that were the same as the conditions of example 1, except that a solution was prepared that was adjusted so that Pb:Ti=1:1, and a $PbTiO_3$ layer, which was to be the base layer, was formed by the spin coating method.

Example 5

The electromechanical transducer element was formed under the conditions that were the same as the conditions of example 1, except that a solution was prepared that was adjusted so that Pb:Ti=1:1, and a $PbTiO_3$ layer with a thickness of 1 nm, which was to be the base layer, was formed by the spin coating method.

Reference Example 1

The electromechanical transducer element was formed under the conditions that were the same as the conditions of example 1, except that a $TiO_2$ layer with a thickness of 7 nm was formed as the base layer by the sputtering method.

Reference Example 2

The electromechanical transducer element was formed under the conditions that were the same as the conditions of example 1, except that a solution was prepared that was adjusted so that Pb:Zr:Ti=115:57:43, and the electromechanical transducer film was formed by the spin coating method.

Reference Example 3

The electromechanical transducer element was formed under the conditions that were the same as the conditions of example 1, except that a solution was prepared that was adjusted so that Pb:Ti=1:1, and a $PbTiO_3$ layer with a thickness of 25 nm, which was to be the base layer, was formed by the spin coating method, and that a solution was prepared that was adjusted so that Pb:Zr:Ti=115:41:59, and the electromechanical transducer film was formed by the spin coating method.

For above-described examples 1 through 5, and reference examples 1 through 3, crystalline orientation ratio distributions of the respective electromechanical transducer films were observed at the position of the outer peripheral chip (A), which is illustrated in FIGS. 7A and 7B. After that, electric characteristics and displacement characteristics (piezoelectric constant) of the electromechanical transducer films were evaluated. For the evaluation of the displacement characteristics, dig processing was performed from the back surface of the substrate, as illustrated in FIG. 3, and vibration evaluation was performed.

An amount of deformation caused by application of an electric field (150 kV/cm) was measured with a laser Doppler vibrometer, and calculated from simulation fitting. Additionally, the film thickness distribution and the displacement distribution were observed. The evaluation results are shown in Table 1.

TABLE 1

| | Ti/ (Zr + Ti) | Seed | Ave_ρ (100) | Δρ (100) | d31 | Δδ/δ_Ave |
|---|---|---|---|---|---|---|
| Example 1 | 51 | Pt (7 nm) | 99% | 0.3% | 145 | 1.5% |
| Example 2 | 55 | Pt (7 nm) | 99% | 0.2% | 132 | 1.6% |
| Example 3 | 45 | Pt (7 nm) | 99% | 0.6% | 128 | 0.5% |
| Example 4 | 51 | Pt (20 nm) | 96% | 3.8% | 140 | 5.2% |
| Example 5 | 51 | Pt (1 nm) | 95% | 4.8% | 138 | 7.4% |
| Reference Example 1 | 51 | $TiO_2$ (7 nm) | 85% | 10.0% | 125 | 14.2% |
| Reference Example 2 | 43 | Pt (7 nm) | 99% | 0.4% | 107 | 1.1% |
| Reference Example 3 | 59 | Pt (7 nm) | 82% | 12.5% | 119 | 15.3% |

For examples 1 through 5, the variation within the sequence in the array direction was within ±8%, and the piezoelectric constant calculated by simulation had the property that was equivalent to the property of the usual ceramic sintered body (the piezoelectric constant was from −120 pm/V through 160 pm/V).

In contrast, for reference examples 1 and 3, it was found that the variation within the sequence in the array direction was significantly deviated from the target variation. For reference example 2, a sufficient piezoelectric constant was not obtained, and the displacement characteristic required for discharging was not obtained.

By using the electromechanical transducer elements according to example 1 through 5, and according to reference examples 1 and 3, liquid discharge heads 2, each of which includes a plurality of electromechanical transducer elements 30 as illustrated in FIG. 3, were formed, and the liquid discharging performance was evaluated. Using the ink whose viscosity was adjusted to 5 cp, the discharge condition for the case of applying a voltage from −10 V through −30V by a simple push waveform was observed. For the liquid discharge heads 2 according to examples 1 through 5, the liquid was successfully discharged from all the nozzle holes, and the liquid was successfully discharged at a high frequency. However, for the liquid discharge heads 2 according to reference examples 1 and 3, the discharge rate was significantly varied in the array direction.

Based on examples 1 through 5 and reference examples 1 through 3, the Zr/Ti ratio in the PZT film is optimized, and the film thickness of the seed layer is controlled so as to reduce the variation of the orientation ratio of PZT (100).

By adjusting the Zr/Ti ratio and the film thickness of the seed layer, as described above, an electromechanical transducer element with favorable characteristics (and having the performance that is equivalent to the performance of bulk ceramics) can be formed in a simple manufacturing process. Then, by performing etching from the back surface of the substrate to form the pressure chamber, and by bonding the nozzle plate provided with the nozzle hole, the liquid discharge head can be obtained.

The liquid discharge head manufactured in this manner has high displacement performance to enhance discharging performance. At the same time, the variation in printing during discharging can be reduced.

The present invention is not limited to the specifically disclosed embodiments, and variations and modifications may be made without departing from the scope of the present invention.

The present application is based on and claims the benefit of priority of Japanese priority application No. 2015-246661 filed on Dec. 17, 2015, the entire contents of which are hereby incorporated herein by reference.

What is claimed is:

1. An electromechanical transducer assembly in which a plurality of electrochemical transducer elements is arranged in a predetermined direction, wherein each of the plurality of electrochemical transducer elements comprises:

a lower electrode;

an electromechanical transducer film; and an upper electrode, wherein each of the electromechanical transducer films is formed of lead (P) zirconate (Zr) titanate (Ti) (PZT), wherein a composition ratio of Ti in the electromechanical transducer film, defined as Ti/(Zr+Ti), is greater than or equal to 45% and less than or equal to 55%, and wherein, in a crystalline orientation of each of the electromechanical transducer films, for ρ(100) that is an orientation ratio of a (100) plane orientation calculated based on a ratio of a peak intensity value of each orientation when a total of the peak intensity values obtained by θ-2θ measurement of an X-ray diffraction method is set to be 1, a gradient Δρ(100) that is calculated from ρ(100) of the plurality of electromechanical transducer elements arranged in the predetermined direction is less than or equal to 5%, wherein the ratio of each peak intensity value of each orientation is represented by ρ(hkl)=I(hkl)/ΣI(hkl), where ρ(hkl) is a ratio of orientation in an (hkl) plane orientation, I(hkl) is the peak intensity value of the orientation, and ΣI(hkl) is the total of the peak intensity values.

2. The electromechanical transducer assembly according to claim 1, wherein, in each of the electrochemical transducer elements, a seed layer formed of lead titanate (PT) is disposed between the electromechanical transducer film and the lower electrode, and wherein a thickness of the seed layer is greater than or equal to 1 nm and less than or equal to 20 nm.

3. The electromechanical transducer assembly according to claim 1, wherein, when an average of ρ(100) of the plurality of electromechanical transducer elements arranged in the predetermined direction is denoted as Ave_ρ(100), Ave_ρ(100) is greater than or equal to 0.95.

4. The electromechanical transducer assembly according to claim 1, further comprising:

an oscillation plate, wherein the plurality of electromechanical transducer elements is formed on the oscillation plate, wherein, when the oscillation plate is formed of a single layer or a plurality of layers, Δds/Ave_ds is within ±5%, where Ave_ds is an average, in the predetermined direction, of a total film thickness of the oscillation plate, and $\Delta ds$ is a gradient of a film thickness of the oscillation plate in one direction.

5. The electromechanical transducer assembly according to claim 1, wherein $\Delta dp/Ave\_dp$ is within ±5%, where Ave_dp is an average, in the predetermined direction, of thicknesses of the electromechanical transducer films, and $\Delta dp$ is a gradient of a film thickness of the electromechanical transducer film in one direction.

6. The electromechanical transducer assembly according to claim 1, wherein, when a displacement characteristic of the electromechanical transducer film at a time at which an electric field strength of 150 kV/cm is applied to the corresponding electromechanical transducer element is denoted as $\delta$, $\Delta\delta/\delta\_ave$ is less than or equal to 8%, where $\Delta\delta$ is a difference between a displacement characteristic of the electromechanical transducer film of the electromechanical transducer element located at one end in the predetermined direction and a displacement characteristic of the electromechanical transducer film of the electromechanical transducer element located at the other end in the predetermined direction, and $\delta\_ave$ is an average value of the displacement characteristics of the electromechanical transducer films.

7. A liquid discharge head comprising:

an electromechanical transducer assembly in which a plurality of electromechanical transducer elements is arranged in a predetermined direction, wherein each of the plurality of electromechanical transducer elements includes a lower electrode;

an electromechanical transducer film; and an upper electrode, wherein each of the electromechanical transducer films is formed of lead (P) zirconate (Zr) titanate (Ti) (PZT), wherein a composition ratio of Ti in the electromechanical transducer film, defined as Ti/(Zr+Ti), is greater than or equal to 45% and less than or equal to 55%, and wherein, in a crystalline orientation of each of the electromechanical transducer films, for $\rho(100)$ that is an orientation ratio of a (100) plane orientation calculated based on a ratio of a peak intensity value of each orientation when a total of the peak intensity values obtained by $\theta$-$2\theta$ measurement of an X-ray diffraction method is set to be 1, a gradient $\Delta\rho(100)$ that is calculated from $\rho(100)$ of the plurality of electromechanical transducer elements arranged in the predetermined direction is less than or equal to 5%, wherein the ratio of each peak intensity value of each orientation is represented by $\rho(hkl)=I(hkl)/\Sigma I(hkl)$, where $\rho(hkl)$ is a ratio of orientation in an (hkl) plane orientation, I(hkl) is the peak intensity value of the orientation, and $\Sigma I(hkl)$ is the total of the peak intensity values.

8. A liquid discharge device comprising:

a liquid discharge head, wherein the liquid discharge head includes an electromechanical transducer assembly in which a plurality of electromechanical transducer elements is arranged in a predetermined direction, wherein each of the plurality of electromechanical transducer elements includes a lower electrode;

an electromechanical transducer film; and an upper electrode, wherein each of the electromechanical transducer films is formed of lead (P) zirconate (Zr) titanate (Ti) (PZT), wherein a composition ratio of Ti in the electromechanical transducer film, defined as Ti/(Zr+Ti), is greater than or equal to 45% and less than or equal to 55%, and wherein, in a crystalline orientation of each of the electromechanical transducer films, for $\rho(100)$ that is an orientation ratio of a (100) plane orientation calculated based on a ratio of a peak intensity value of each orientation when a total of the peak intensity values obtained by $\theta$-$2\theta$ measurement of an X-ray diffraction method is set to be 1, a gradient $\Delta\rho(100)$ that is calculated from $\rho(100)$ of the plurality of electromechanical transducer elements arranged in the predetermined direction is less than or equal to 5%, wherein the ratio of each peak intensity value of each orientation is represented by $\rho(hkl)=I(hkl)/\Sigma I(hkl)$, where $\rho(hkl)$ is a ratio of orientation in an (hkl) plane orientation, I(hkl) is the peak intensity value of the orientation, and $\Sigma I(hkl)$ is the total of the peak intensity values.

* * * * *